United States Patent
Park et al.

(10) Patent No.: US 9,659,645 B2
(45) Date of Patent: May 23, 2017

(54) RESISTIVE MEMORY DEVICE AND METHOD OF WRITING DATA

(71) Applicant: SAMSUNG ELECTRONICS CO., LTD., Suwon-si, Gyeonggi-Do (KR)

(72) Inventors: Hyun-Kook Park, Anyang-si (KR); Yeong-Taek Lee, Seoul (KR); Dae-Seok Byeon, Seongnam-si (KR); Yong-Kyu Lee, Hwaseong-si (KR); Hyo-Jin Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 128 days.

(21) Appl. No.: 14/665,140

(22) Filed: Mar. 23, 2015

(65) Prior Publication Data

US 2015/0380085 A1 Dec. 31, 2015

(30) Foreign Application Priority Data

Jun. 30, 2014 (KR) .......................... 10-2014-0081220

(51) Int. Cl.
*G11C 7/10* (2006.01)
*G11C 13/00* (2006.01)
*G11C 11/16* (2006.01)

(52) U.S. Cl.
CPC ...... *G11C 13/0069* (2013.01); *G11C 11/1675* (2013.01); *G11C 11/1693* (2013.01); *G11C 13/0002* (2013.01); *G11C 13/0023* (2013.01); *G11C 13/0061* (2013.01); *G11C 13/0064* (2013.01); *G11C 13/0097* (2013.01); *G11C 2213/71* (2013.01)

(58) Field of Classification Search
CPC ............ G11C 13/0069; G11C 13/0064; G11C 13/0002; G11C 13/0023; G11C 13/0061
USPC .............................................. 365/189.04, 148
See application file for complete search history.

(56) References Cited

U.S. PATENT DOCUMENTS

| | | | |
|---|---|---|---|
| 7,751,232 B2 | 7/2010 | Lee et al. | |
| 7,852,659 B2 | 12/2010 | Kang et al. | |
| 8,248,860 B2 | 8/2012 | Lee et al. | |
| 8,385,106 B2 | 2/2013 | Ong | |
| 8,395,924 B2 | 3/2013 | Lee | |
| 8,446,749 B2 | 5/2013 | Takase | |
| 2006/0007729 A1* | 1/2006 | Cho ................... | G11C 13/0004 365/163 |
| 2009/0052233 A1* | 2/2009 | Nakai ................. | G11C 7/1048 365/163 |

(Continued)

FOREIGN PATENT DOCUMENTS

KR    20120015167 A    2/2012

*Primary Examiner* — Viet Q Nguyen
(74) *Attorney, Agent, or Firm* — Volentine & Whitt, PLLC

(57) ABSTRACT

A method of writing data in a resistive memory device having a memory cell array divided into first and second tiles includes; performing a first simultaneous write operation by performing a set write operation performed on resistive memory cells of the first tile while simultaneously performing a reset write operation on resistive memory cells of the second tile in response to the write command, and performing a second simultaneous write operation by performing a reset write operation on resistive memory cells of the first tile while simultaneously performing a set write operation on resistive memory cells of the second tile in response to the write command.

17 Claims, 22 Drawing Sheets

(56) References Cited

U.S. PATENT DOCUMENTS

| | | | |
|---|---|---|---|
| 2010/0027315 A1* | 2/2010 | Kim | G11C 8/12 365/148 |
| 2010/0211725 A1* | 8/2010 | Nagashima | G11C 13/0004 711/103 |
| 2012/0020161 A1* | 1/2012 | Haukness | G06F 12/0246 365/185.17 |
| 2012/0163092 A1 | 6/2012 | Jung et al. | |
| 2012/0182785 A1 | 7/2012 | Otsuka | |
| 2013/0077383 A1* | 3/2013 | Huang | G11C 13/0004 365/148 |
| 2013/0135923 A1* | 5/2013 | Yon | G11C 13/0004 365/163 |
| 2013/0155756 A1 | 6/2013 | Nagashima et al. | |
| 2013/0250657 A1* | 9/2013 | Haukness | G11C 13/0069 365/148 |
| 2013/0265837 A1* | 10/2013 | Kwon | G11C 7/22 365/194 |
| 2013/0272053 A1* | 10/2013 | Tiburzi | G11C 13/0007 365/148 |
| 2014/0063904 A1* | 3/2014 | Yon | G11C 13/004 365/148 |
| 2014/0071748 A1* | 3/2014 | Li | G11C 13/0069 365/163 |
| 2014/0185362 A1* | 7/2014 | Haukness | G11C 13/0002 365/148 |
| 2014/0362633 A1* | 12/2014 | Otsuka | G11C 13/0097 365/148 |
| 2015/0003151 A1* | 1/2015 | Lee | G11C 16/10 365/185.02 |
| 2015/0194212 A1* | 7/2015 | Faraoni | G11C 13/0064 365/148 |
| 2015/0287459 A1* | 10/2015 | Navon | G11C 13/0069 365/148 |
| 2016/0139828 A1* | 5/2016 | Yan | G06F 3/0616 711/103 |

* cited by examiner

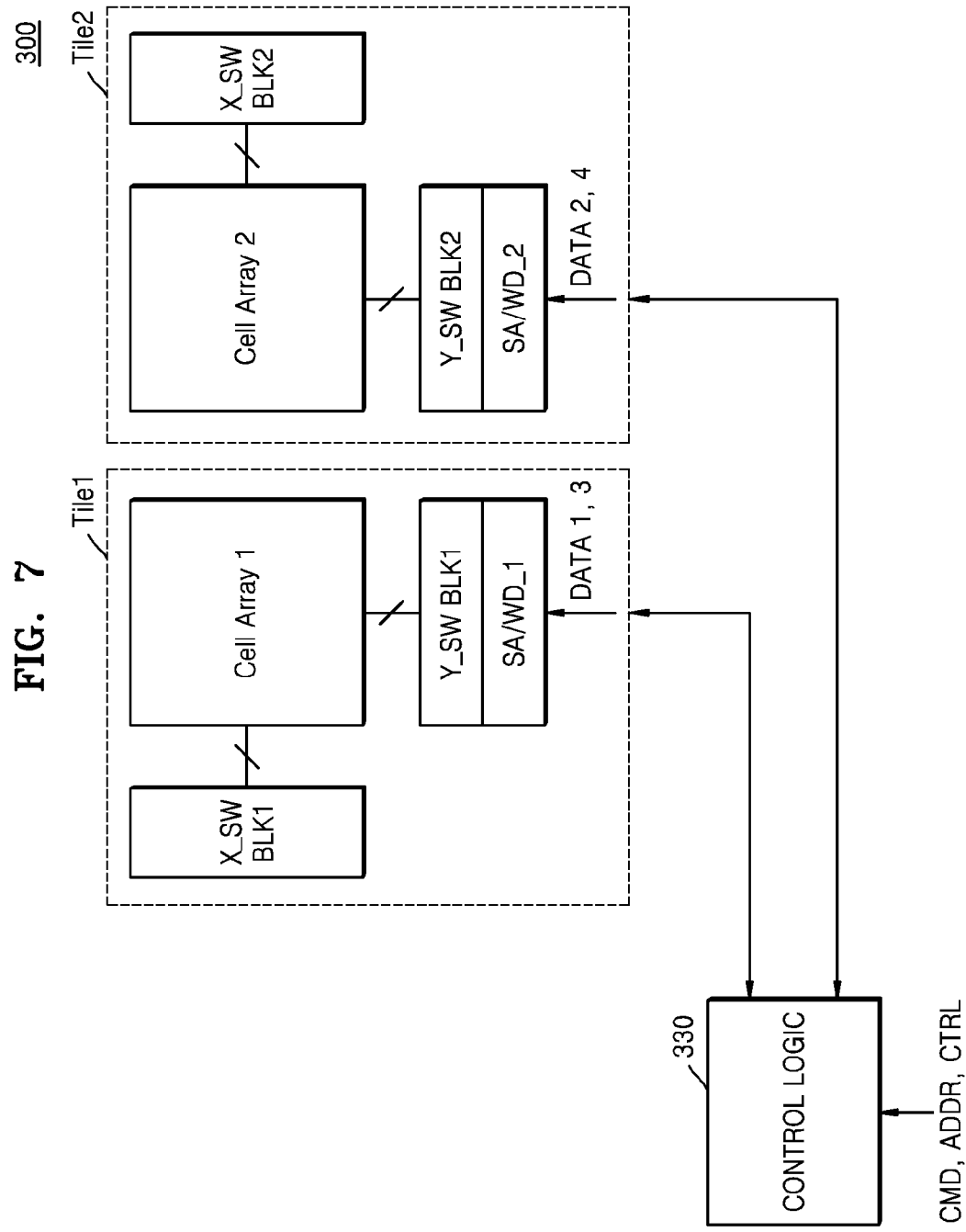

| Case | | | Separate Write | Simultaneous Write |
|---|---|---|---|---|
| If limited Current =100uA | NECESSARY Write Step # | SET | TEN TIMES | ELEVEN TIMES |
| | | RESET | ONCE | |
| | | Write bit # /Step | SET 10 bit RESET 100 bit (Serial) | SET 9 bit RESET 9 bit (Parallel) |
| | NECESSARY W/D # | | 100ea | ABOUT 20ea |

| Case | | | Separate Write | Simultaneous Write |
|---|---|---|---|---|
| If limited W/D # =20ea | NECESSARY Write Step # | SET | FIVE TIMES | TEN TIMES |
| | | RESET | FIVE TIMES | |
| | | Write bit # /Step | SET 20 bit RESET 20 bit (Serial) | SET 10 bit RESET 10 bit (Parallel) |
| | NECESSARY Max Current | | 200uA | 110uA |

FIG. 16
INPUT Data = 1111 @Tile1, 0110 @Tile2, 0110 @Tile3, 0000 @Tile4
Pre-Read Data = 1000 @Tile1, 1100 @Tile2, 1000 @Tile3, 1110 @Tile4
Compare (SET/RESET) → 0/3 @Tile1, 1/1 @Tile2, 1/2 @Tile3, 3/0 @Tile4
Temporary Logic GROUP1 = Tile1 & Tile4
Temporary Logic GROUP2 = Tile2 & Tile3
Simultaneous SET & RESET write (SET/RESET)
Tile1 & Tile4 = 3/3
Tile2 & Tile3 = 2/3

RESISTIVE MEMORY DEVICE AND METHOD OF WRITING DATA

CROSS-REFERENCE TO RELATED APPLICATIONS

This application claims the benefit of Korean Patent Application No. 10-2014-0081220 filed on Jun. 30, 2014, the subject matter of which is hereby incorporated by reference.

BACKGROUND

The inventive concept relates to resistive memory devices, memory systems including a resistive memory device, and methods of writing data to a resistive memory device. More particularly, the inventive concept to resistive memory devices having improved efficiency during write operations and methods of operating the resistive memory device.

According to demand for high capacitive memory devices with low power consumption, research on next generation memory devices that are non-volatile and do not need a refreshing operation has been conducted. Such a next generation memory device needs to have high integration property of a dynamic random access memory (DRAM), non-volatile property of a flash memory, and high speed property of a static RAM (SRAM). As a next generation memory device, a phase change RAM (PRAM), a nano-floating gate memory (NFGM), polymer RAM (PoRAM), a magnetic RAM (MRAM), a ferroelectric RAM (FeRAM), or a resistive RAM (RRAM) has been suggested.

SUMMARY

Embodiments of the inventive concept provide a resistive memory device having an improved efficiency during data write operations and methods of operating the resistive memory device.

The N tiles may include a first tile and a second tile, and when the set write operation is performed on at least some memory cells included in the first tile, the reset write operation may be simultaneously performed on at least some memory cells included in a second tile.

Each of the N tiles may include a plurality of memory cells that are connected to a plurality of first lines and a plurality of second lines, and in the first simultaneous write operation, an electric current flowing from the plurality of the first lines toward the plurality of second lines may be applied to memory cells of the some tiles on which the set write operation is performed, and an electric current flowing from the plurality of second lines toward the plurality of first lines may be applied to the memory cells included in the remaining tiles on which the reset write operation is performed.

A current amount consumed during the first simultaneous write operation and a current amount consumed during the second simultaneous write operation may be identical.

In each of the first and second simultaneous write operations, the number of memory cells on which the set write operation is performed may be the same as the number of memory cells on which the reset write operation is performed.

The resistive memory device may include a plurality of layers, each including one or more tiles, and the first group may include two or more tiles included in at least two layers.

The method may further include performing a pre-read operation on at least some of the tiles in the first group before performing the first and second simultaneous write operations, in response to the write command.

The tiles included in the first group may be variable according to data read through the pre-read operation.

The tiles included in the first group may be variable according to combination of the data read through the pre-read operation and write data accompanying with the write command.

The method may further include: performing a verification read operation on data written through the first and second simultaneous write operations; and repeatedly performing the first and second simultaneous write operations according to a result of verifying the data.

According to an aspect of the inventive concept, there is provided a method of operating a resistive memory device that includes a plurality of tiles, each including a plurality of memory cells connected to a plurality of first lines and a plurality of second lines, the method including: receiving a first write command; performing a first set write operation in response to the first write command, by applying an electric current flowing from the plurality of first lines to the plurality of second lines to some of the memory cells in a first tile; and performing a first reset write operation simultaneously with the first set write operation, by applying an electric current flowing from the plurality of second lines to the plurality of the first lines to some of the memory cells in a second tile.

BRIEF DESCRIPTION OF THE DRAWINGS

Embodiments of the inventive concept will be more clearly understood from the following detailed description taken in conjunction with the accompanying drawings in which:

FIG. 7 is a block diagram of a memory device for illustrating a write operation according to an embodiment of the inventive concept;

FIG. 16 is a diagram showing examples of a data comparison operation and a grouping result;

DETAILED DESCRIPTION

Embodiments of the inventive concept will now be described in some additional detail with reference to the accompanying drawings. The inventive concept may, however, be embodied in many different forms and should not be construed as being limited to only the illustrated embodiments. Throughout the written description and drawings like reference numbers and labels denote like or similar elements.

An expression used in the singular encompasses the expression of the plural, unless it has a clearly different meaning in the context. In the present specification, it is to be understood that the terms such as "including", "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list.

Figure 1:
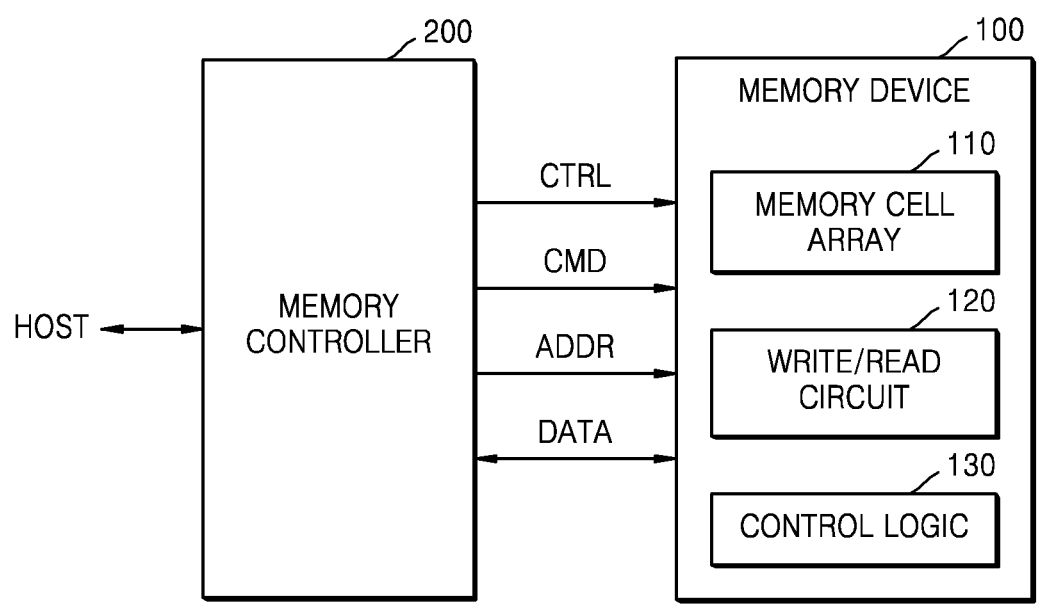
FIG. 1 is a block diagram of a memory system including a resistive memory device according to an embodiment of the inventive concept.

Figure (FIG. 1 is a block diagram of a memory system 10 including a resistive memory device 100 according to an embodiment of the inventive concept.

Referring to FIG. 1, the memory system 10 generally includes the resistive memory device 100 (hereinafter, referred to as "memory device 100") and a memory controller 200. The memory device 100 includes a memory cell array 110, a write/read circuit 120 and control logic 130. Since the memory cell array 110 of the memory device 100 includes resistive memory cells, the memory system 10 may be referred to as a "resistive memory system".

The memory controller 200 may be used to control the memory device 100 to read data stored in the memory device 100 and/or write data to the memory device 100 in response to a corresponding write or read request from a host. In particular, the memory controller 200 provides the memory device 100 with an address ADDR, a command CMD, and one or more control signal(s) CTRL that control the programming (or writing) of "write data" to, the reading of "read data" from, and/or the erasing of data from the memory device 100. Read data and write data are collectively or singularly indicated in FIG. 1 as "DATA" being communicated between the memory controller 200 and memory device 100.

Although not shown in FIG. 1, the memory controller 200 may also include a random access memory (RAM), a processing unit, a host interface, and a memory interface. The RAM may be used as an operation memory of the processing unit. The processing unit may control operations of the memory controller 200. The host interface may include a protocol for performing data exchange between the host and the memory controller 200. For example, the memory controller 200 may communicate with outside (HOST) via at least one selected from various interface protocols such as a universal serial bus (USB), a multimedia card (MMC), a peripheral component interconnect (PCI)—express (E), an advanced technology attachment (ATA), a serial advanced technology attachment (SATA), a parallel advanced technology attachment (PATA), a small computer system interface (SCSI), an enhanced small device interface (ESDI), and an integrated drive electronics (IDE).

The memory cell array 110 includes a plurality of resistive memory cells (not individually shown) that may be respectively disposed in a matrix formed by first signal lines and second signal lines. Here, the first signal lines may be bit lines and the second signal lines may be word lines, or vice verses. The resistive memory cells arranged in the memory cell array 110 may be a single-level cells (SLC) configured to store one bit of data per memory cell, and/or multi-level cells (MLC) configured to store two or more bits of data per memory cell, where data may be written in accordance with a set of resistance distributions respectively corresponding to a data state (e.g., '0' and '1' for SLC, '00', '01', '10' and '11' for 2-bit MLC, etc.).

According to different embodiments of the inventive concept, the memory cell array 110 may implemented as a two-dimensional (or horizontal) structure, or a three-dimensional (or vertical) structure.

Hence, the memory cell array 110 includes resistive memory cells each capable of exhibiting a variable resistance. For example, the resistive memory cells of the memory device 100 may include a phase-changeable material, such as Ge—Sb—Te (or GST) having the resistance that varies in accordance with an applied temperature. Such a resistive memory device 100 may be referred to as a phase-change RAM or PRAM. Alternately, the resistive memory cells of the memory device 100 may include an upper electrode, a lower electrode, and complex metal oxide disposed between the upper and lower electrodes, and the memory device 100 may be a resistive RAM or RRAM. Alternately, if the resistive memory cells of the resistive memory device include an upper electrode formed from a magnetic material, a lower electrode formed from a magnetic material, and a dielectric material disposed between the upper and lower electrodes, the memory device 100 may be a magnetic RAM or MRAM.

The write/read circuit 120 may be used to control execution of write operations and read operations with respect to the resistive memory cells of the memory cell array 110. In the illustrated example of FIG. 1, the write/read circuit 120 is assumed to be connected to the resistive memory cells via bit lines. The write/read circuit 120 includes a write driver configured to write data to one or more of the resistive memory cells, and a sense amplifier configured to sense and amplify the data stored by one or more of the resistive memory cells.

Control logic 130 may be used to control the overall operation of the memory device 100, including the operation of the write/read circuit 120 in performing memory operations such as write, read, and/or erase operations. For example, the control logic 130 may provide the write/read circuit 120 with various pulse signals used as write pulses and/or read pulses during write and read operations with respect to the memory device 100. The write/read circuit 120, upon receiving pulse signal(s) from the control logic 130, may then provide one or more write currents (or write voltages), or one or more read currents (or read voltages) to the memory cell array 110. A pulse generator (not shown) generating the pulse signals may be included as part of the control logic 130, but the pulse generator might be externally disposed relative to the control logic 130.

According to embodiments of the inventive concept, the memory cell array 110 may divided into a plurality of memory cell regions (hereafter, "regions"). This division may be defined in many different ways. For example, each region may include memory cells commonly connected to one or more word lines and/or one or more bit lines, where the word lines are connected to a row selection block (or row switching block) and the bit lines are connected to a column selection block (or column switching block). Using this or similar division approaches, each region may be designated as a "tile" within the memory cell array 110.

In certain embodiments of the inventive concept, two or more tiles may be designated (or functionally arranged) as belonging to a "group", and two or more groups may be designated as belonging to a "bank". Alternately, two or more tiles may be designated as belonging to a bank and two or more banks may be designated as belonging to a group. According to either designation approach, a group will include more than one tile.

Upon receiving a write command from the memory controller 200, the memory device 100 will perform a write operation based on a group including at least two tiles. For example, if a particular group includes N tiles, where 'N' is a natural number greater than 1, the memory device 100 will cause write data to be stored with respect to the N tiles of the group in response to single write command. In this context, however, different types of write operations may be selectively directed to the tiles of a group. For example, a first type write operation (hereafter, "first write operation") may be performed with respect to a first set of tiles, and a second type write operation (hereafter, "second write operation") may be performed with respect to a second set of tiles, where each one of the first and second sets of tiles includes at least one tile.

Assuming the memory cell array 110 includes resistive memory cells, a reset write or a set write may be selectively performed with respect to the resistive memory cells. In this context, for example, a resistive memory cell is assumed to be programmable in a "set state" having a relatively lower resistance value and in a "reset state" having a relatively higher resistance value. Thus, if a write operation is performed on a memory cell in a manner that increases its resistance value, the operation may be said to be a "reset write operation", and if a write operation is performed on the memory cell in a manner that decreases its resistance value, the operation may be said to be a "set write operation". For example, a forward current (e.g., a current from a bit line to a word line) may be applied to the memory cell in order to perform the set write operation, and a backward current (e.g., a current from the word line to the bit line) may be applied to the memory cell in order to perform the reset write operation.

Hence, write operations may be classified as set write operations and/or reset write operations, and in response to a single write command the memory device 100 may perform a set write operation on a first set of tiles in a group, and simultaneously perform a reset write operation on a second set of tiles in the group. Here, the term "simultaneously" denotes a relationship wherein a first time period during which the set write operation is performed and a second time period during which the reset write operation is performed overlap at least in part. As a result, for example, a set write operation performed on a first set of tiles and the reset write operation performed on a second set of tiles may be defined as a "first simultaneous write operation", while a reset write operation performed on the first set of tiles and the set write operation performed on the second set of tiles may be defined as a "second simultaneous write operation".

Accordingly, during a write operation executed in response to a single write command and writing certain write data to a designated group, a first portion of the write data may be written to a first set of tiles in the group during a first simultaneous write operation, and a second portion of the write data may be written to a second set of tiles in the group during a second simultaneous write operation. Hence, in certain embodiments of the inventive concept, a unitary write operation performed in response to a single write command may include a first simultaneous write operation and a second simultaneous write operation.

In the working description that follows it is assumed for the sake of simplicity that a group includes only two (first and second) tiles divided respectively into first and second sets. Thus, a first portion of write data may be written to selected memory cells of the first and second tiles during the first simultaneous write operation, and a second portion of the write data may be written to selected memory cells in the first and second tiles during the second simultaneous write operation, wherein the first portion of the write data includes set data values directed to the selected memory cells of the first tile and reset data values directed to the selected memory cells of the second tile and the second portion of the write data includes reset data values directed to the selected memory cells of the first tile and set data values directed to the selected memory cells of the second tile. Of course, this example assumes that the memory cells are configured as SLC.

Using this approach, a large amount of write data may be written to multiple tiles in a group in response to a single write command, thereby efficiently using an allowable maximum current to perform the write operation. That is, during a write operation directed to selected resistive memory cells of a group, the magnitude of allowable current that may be drawn during the write operation will be restricted, as will the number of selected memory cells that may be written to during the write operation. However, according to embodiments of the inventive concept, the number of memory cells that may be written to during a write operation is notably increased within the limits of the magnitude of allowable current that may be consumed during the write operation. In the context of the foregoing example, both a first simultaneous write operation and/or a second simultaneous write operation may be performed within the limits of the magnitude of allowable current for the write operation.

In certain embodiments of the memory system 10 shown in FIG. 1, the memory controller 200 and memory device 100 may be commonly integrated as a single semiconductor device. For example, the memory controller 200 and memory device 100 may be integrated as one semiconductor device and configured a memory card, such as a PC card (PCMCIA), a compact flash (CF) card, a smart media card (SMC), a memory stick, a multimedia card (MMC, RS-MMC, or MMCmicro), a secure digital (SD) card (SD, miniSD, or microSD), and a universal flash storage (UFS). Alternately, the memory controller 200 and memory device 100 may be integrated as one semiconductor device and configured as a solid state disk/drive (SSD).

Figure 2:
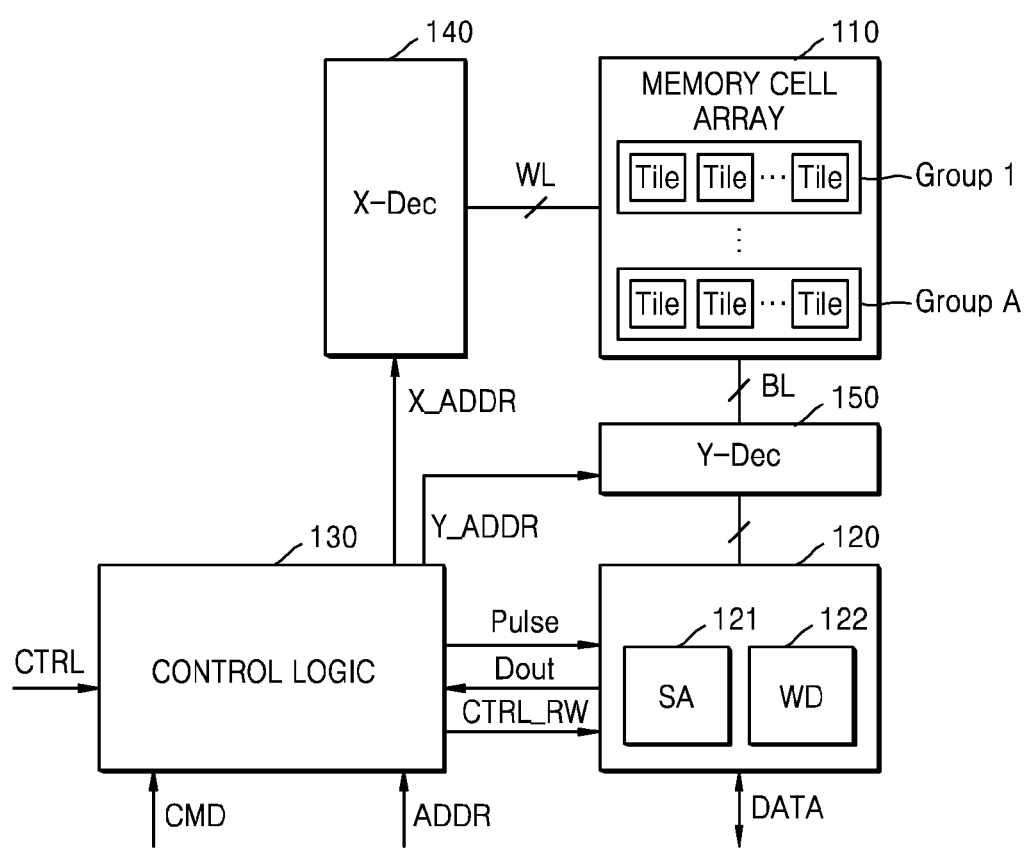
FIG. 2 is a block diagram of an example of the resistive memory device of FIG. 1.

FIG. 2 is a block diagram further illustrating in one example the memory device 100 of FIG. 1.

Referring to FIG. 2, the memory device 100 comprises in addition to the memory cell array 110, write/read circuit 120, and control logic 130, a row decoder 140 and a column decoder 150. Further, the write/read circuit 120 is shown as including a sense amplifier 121 (SA) and a write driver 122 (WD), and the memory cell array 110 is shown as being divided into a plurality of groups ranging from first group (Group 1) through an Ath group (Group A), each respectively including multiple tiles.

In the working example of FIG. 2, it is further assumed that each tile of the memory cell array 110 includes resistive memory cells connected to multiple bit lines and multiple word lines.

An address ADDR indicating selected memory cell(s) is assumed to include a row address X_ADDR selecting a word line WL of the memory cell array 110 and a column address Y_ADDR selecting a bit line BL of the memory cell array 110. The row decoder 140 performs selection of the word line WL in response to the row address X_ADDR and the column decoder 150 performs selection of bit line BL in response to the column address Y_ADDR.

The write/read circuit 120 is connected to the bit line BL and configured to either write data to or read data from the selected memory cell(s). For example, the write/read circuit 120 may receive a write pulse from the control logic 130, and the write driver 122 may be used to provide the memory cell array 110 with a write current and/or write voltage via the column decoder 150 in response to the write pulse. For example, if a set pulse is received the write driver 122 may provide the memory cell array 110 with a set current or a set voltage in response to the set pulse, and if a reset pulse is received the write driver 122 may provide the memory cell array 110 with a reset current or a reset voltage in response to the reset pulse.

When performing a data read operation, the write/read circuit 120 may generate a read current (or a read voltage) used to perform the read operation and may provide the memory cells with the read current (or read voltage). The sense amplifier 121 may include a current generator (or a voltage generator), and including a comparator connected to a bit line node (e.g., a sense node) for sensing a stored data state. Thus, one end of the comparator is connected to the sense node and another end of the comparator is connected to a reference voltage in order to properly sense the stored data state.

The control logic 130 may be used to provide various internal control signals CTRL_RW using to write data in the memory cell array 110, or to read data from the memory cell array 110 based on the received command CMD, address ADDR, and control signal(s) CTRL communicated by the memory controller 200. In this manner, the control logic 130 may be used to control the overall operation in the memory device 100.

As previously mentioned, tiles in the various groups of the memory device 100 may be differently defined according to different embodiments of the inventive concept. Given the working assumptions described above, the row decoder 140 may include row switching blocks configured to perform selecting operations with respect to the plurality of word lines, and the column decoder 150 may include column switching blocks configured to perform selecting operations with respect to the plurality of bit lines.

In FIG. 2, the tiles of the memory cell array 110 and the row decoder 140/column decoder 150 are shown as being completely separate in implementation. However, in other embodiments of the inventive concept at least some parts of the row decoder 140/column decoder 150 may be included in the designated tiles. Each of the row decoder 140/column decoder 150 may include a unit for decoding an address ADDR, as well as the row switching blocks and/or column switching blocks. In addition, each of the tiles may be defined as a unit including at least one row switching block and at least one column switching block associated with the memory cells of the tile. For example, assuming the memory cell array 110 include X tiles, the row decoder 140 may include X row switching blocks and the column decoder 150 may include X column switching blocks. Here, each of the tiles may include one row switching block for selecting the word lines of the memory cells and one column switching block for selecting the bit lines of the memory cells, with the memory cells.

During a write operation directed to memory cells of the memory cell array 110, write data received in conjunction with a single write command may be written according to a group unit. In this regard, a write operation directed to a group may include one or more simultaneous write operations executed with respect to the tiles of the group in response to the single write command. In each of the simultaneous write operations, a set write operation may be performed with respect to the memory cells included in a first set of tiles included in the group, and simultaneously, a reset write operation may be performed with respect to the memory cells included in a second set of tiles. Following the write operation or following each one of the simultaneous write operations included in the write operation, a verification read operation may be performed on the memory cells selected by the write operation. If it is determined during the verification read operation that one or more read errors has occurred, the one or more simultaneous write operations of the write operation may be repeated.

In the example illustrated in FIG. 2, the number of tiles included in each one of the first through Ath groups (Group 1 through Group A) may be equal to or different from each other. The set write operation and/or reset write operation may be performed with respect to all or some of the tiles included in a group. For example, assuming a group includes first, second and third tiles, a set write operation and a reset write operation may be performed simultaneously with respect to the first tile and second tile in response to a first write command, and a set write operation and a reset write operations may be simultaneously performed with respect to the first tile and third tile in response to a second write command following the first write command. Thus, according to embodiments of the inventive concept, memory cells in any two or more tiles of a group may be subjected to simultaneously performed set and reset write operations in response to a received write command, where the particular tiles included in a group may be selected by the memory device 100 or the memory controller 200.

Figure 3:
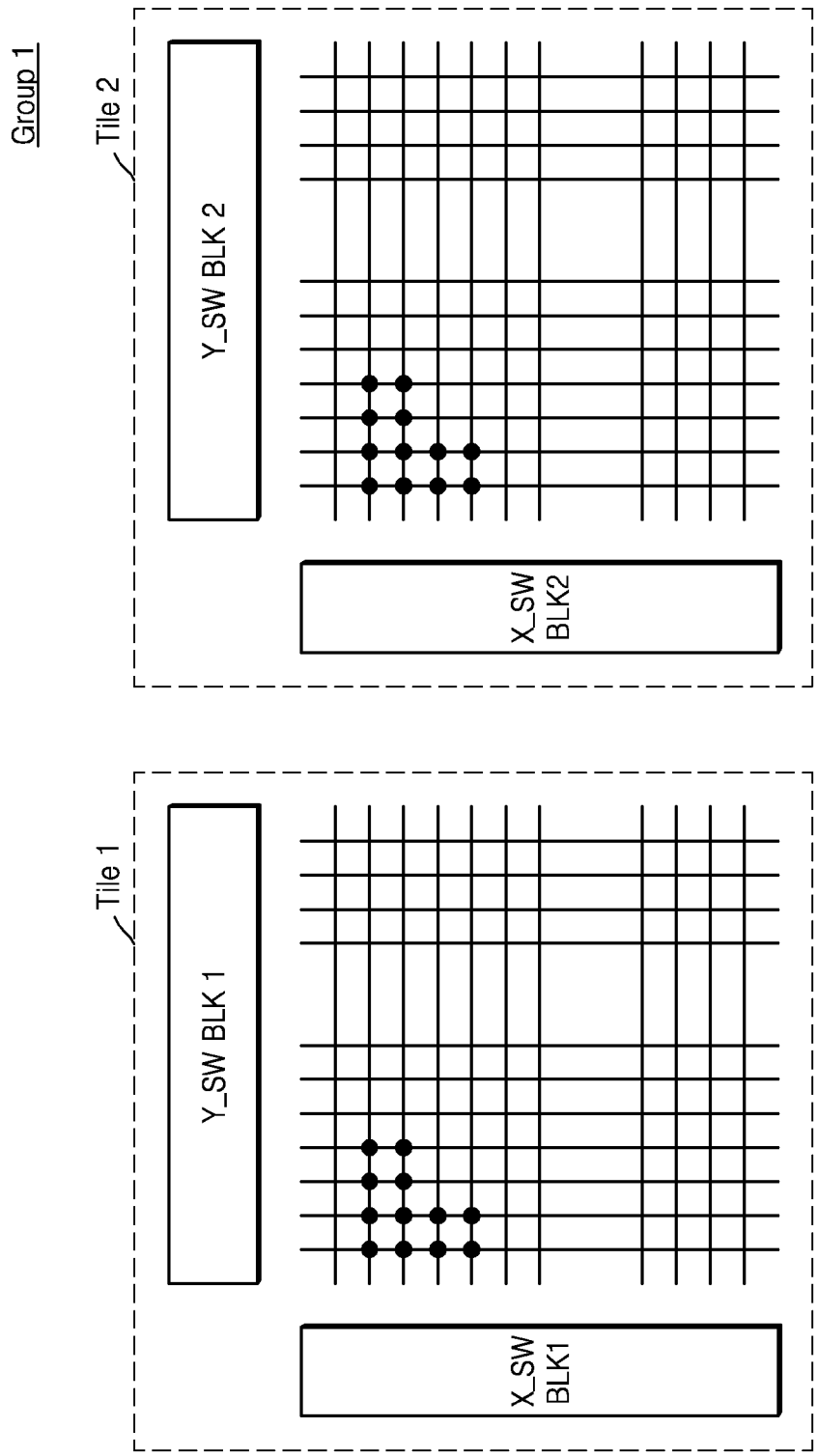
FIG. 3 is a diagram showing a first tile and a second tile included in the same group.

FIG. 3 is a conceptual diagram illustrating one example of a first tile (Tile 1) and a second tile (Tile 2) included in a group (Group 1). In FIG. 3, it is assumed that each of Tile1 and Tile2 includes the row switching block and column switching block associated with a plurality of memory cells. Tile1 includes memory cells arranged in regions of the constituent memory cell array 110 where word lines and bit lines cross each other, and where a first row switching block X_SW BLK1 and a first column switching block Y_SW BLK1 perform selecting operations with respect to the word lines and the bit lines. Similarly, Tile2 includes memory cells arranged in regions of the constituent memory cell array 110 where word lines and bit lines cross each other, and where a second row switching block X_SW BLK2 and a second column switching block Y_SW BLK2 perform selecting operations.

The control logic 130 shown in FIG. 2 provides each of the tiles with the row address X_ADDR and the column address Y_ADDR so as to select at least some of the memory cells in each of the tiles. Thus, under the control of the control logic 130, at least some of the memory cells in Tile1 may be selected, and simultaneously, at least some of the memory cells in Tile2 may be selected. In this manner, one of a set write operation and a reset write operation may be performed with respect to the selected memory cells of Tile1, and simultaneously, the other of the set write operation and the reset write operation may be performed with respect to the selected memory cells of Tile2.

Figure 4:
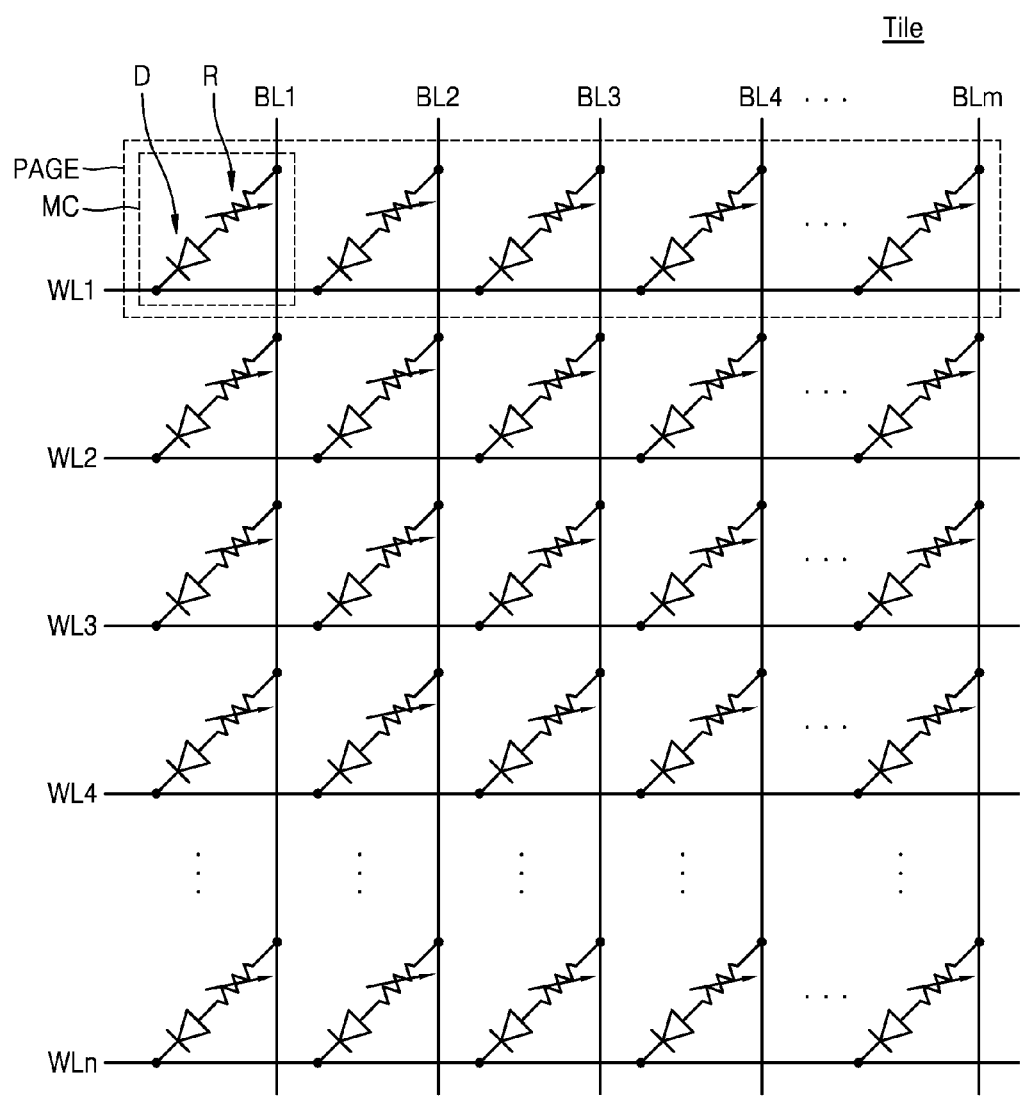
FIG. 4 is a circuit diagram of a memory cell array shown in FIG. 2.

FIG. 4 is a partial circuit diagram illustrating one possible implementation example for the memory cell array 110 of FIG. 2 in the context of one tile (Tile). Other tiles in the memory cell array 110 may have the same structure as the Tile shown in FIG. 4.

Referring to FIG. 4, Tile includes memory cells arranged in a horizontal memory cell array structure. The tile includes word lines WL1 through WLn, bit lines BL1 through BLm, and respective memory cells MC. Here, the number of the word lines WL, the number of bit lines BL, and the number of memory cells MC are variable according to embodiment. Also, the memory cells MC connected to the same word line WL may be defined in a page unit (PAGE).

Each of the memory cells MC includes a variable resistance device R and a selection device D. Here, the variable resistance device R may be referred to as a variable resistance material, and the selection device D may be referred to as a switching device.

The variable resistance device R may be connected between one of the bit lines BL1 through BLm and the selection device D, and the selection device D may be connected between the variable resistance device R and one of the word lines WL1 through WLn. Alternately, the selection device D may be connected between one of the bit lines BL1 through BLm and the variable resistance device R, and the variable resistance device R may be connected between the selection device D and one of the word lines WL1 through WLn.

The variable resistance device R may be switched to one of a plurality of resistance states by an applied electric pulse. Thus, for example, the variable resistance device R may include a phase-change material having a crystallization state that varies with applied electrical current. The phase-change material may, GaSb, InSb, InSe, $Sb_2Te_3$, and GeTe that are compounds of two elements, GeSbTe, GaSeTe, InSbTe, $SnSb_2Te_4$, and InSbGe that are compounds of three elements, and AgInSbTe, (GeSn)SbTe, GeSb(SeTe), and $Te_{81}Ge_{15}Sb_2S_2$ that are compounds of four elements, for example.

The phase-change material may have an amorphous state having a relatively high resistance and a crystalline state having a relatively low resistance. The phase of the phase-change material may be changed by Joule's heat generated according to the current amount. In addition, the data may be written by using the phase change.

In addition, according to another embodiment of the inventive concept, the variable resistance device R may include perovskite compounds, transmission metal oxide, magnetic materials, ferromagnetic materials, or antiferromagnetic materials, instead of the phase-change material.

The selection device D may be connected between one of the word lines WL1 through WLn, and the variable resistance material R, and may control supply of the electric current to the variable resistance device R according to a voltage applied to the connected word line and the bit line. The selection device D may be a PN junction or a PIN junction diode. An anode of the diode may be connected to the variable resistance device R and a cathode of the diode may be connected to one of the word lines WL1 through WLn. Here, if a voltage difference between the anode and the cathode of the diode becomes greater than a threshold voltage of the diode, the diode is turned ON so as to supply the electric current to the variable resistance device R.

Figure 5A:
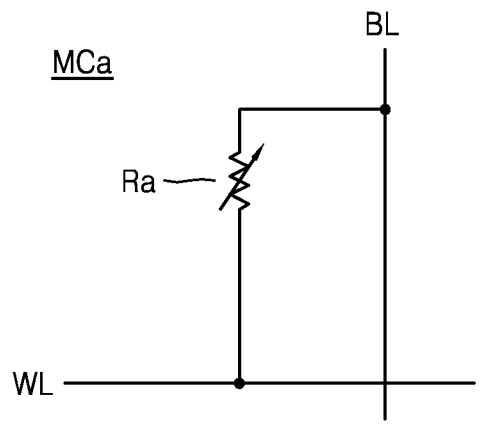
FIGS. 5A, 5B and 5C are circuit diagrams showing modified examples of the memory cell of FIG. 4.
Figure 5B:
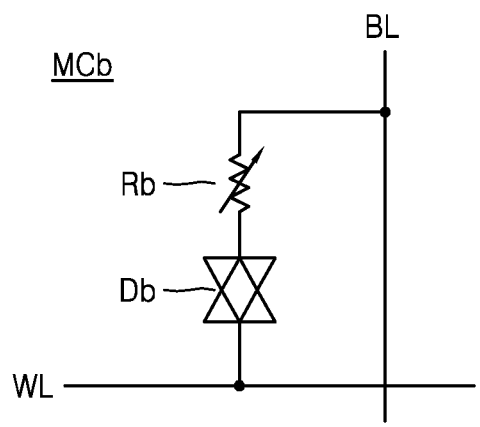
Figure 5C:
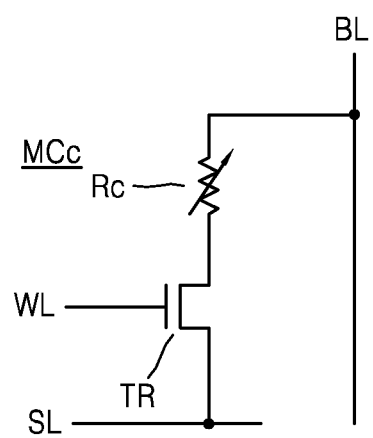

FIGS. 5A, 5B and 5C are respective circuit diagrams illustrating different possible examples of the memory cell MC shown in FIG. 4.

Thus, in FIG. 5A, a memory cell MCa includes a variable resistance device Ra, and the variable resistance device Ra may be connected between a bit line BL and a word line WL. The memory cell MCa may store data by using voltages applied to the bit line BL and the word line WL. In FIG. 5B, the memory cell MCb may include a variable resistance device Rb and a bidirectional diode Db. The variable resistance device Rb may include a resistor material for storing data. The bidirectional diode Db is connected between the variable resistance device Rb and the word line WL, and the variable resistance device Rb may be connected between the bit line BL and the bidirectional diode Db. Locations of the bidirectional diode Db and the variable resistance device Rb may be exchanged. A leakage current flowing in nonselected resistor cells may be blocked by the bidirectional diode Db. And in FIG. 5C, a memory cell MCc may include a variable resistance device Rc and a transistor TR. The transistor TR may be a selection device for supplying or blocking the electric current to the variable resistance device Rc according to a voltage of the word line WL, that is, a switching device. In the example of FIG. 5C, a source line SL for adjusting voltage levels at opposite terminals of the variable resistance device Rc may be further included, in addition to the word line WL. The transistor TR is connected between the variable resistance device Rc and the source line SL, and the variable resistance device Rc may be connected between the bit line BL and the transistor TR. Locations of the transistor TR and the variable resistance device Rc may be exchanged. The memory cell MCc may be selected or may not be selected according to turning on/turning off of the transistor TR that is driven by the word line WL.

Figure 6A:
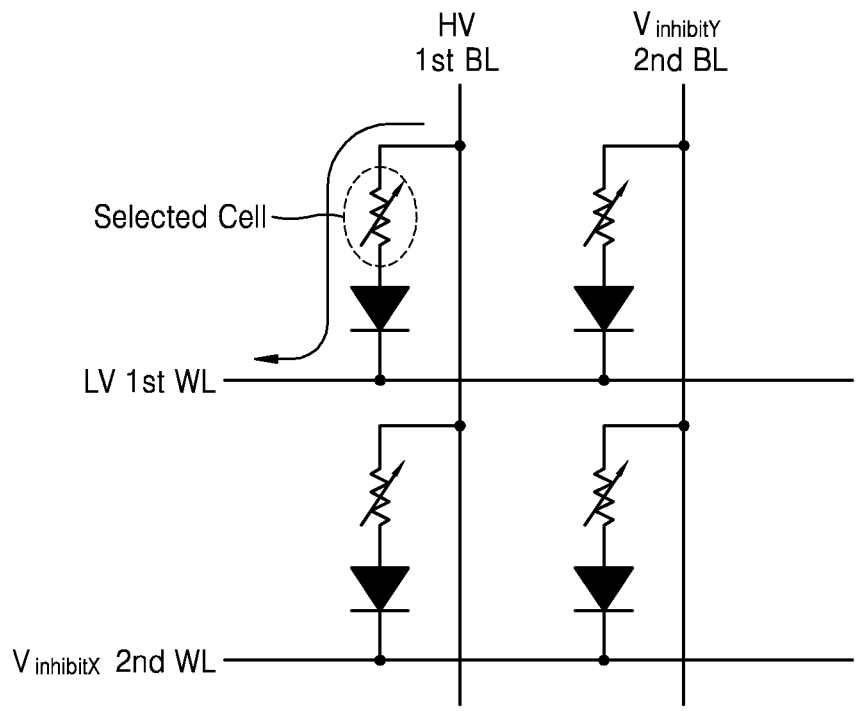
FIGS. 6A and 6B are circuit diagrams showing examples of a set write operation and a reset write operation.
Figure 6B:
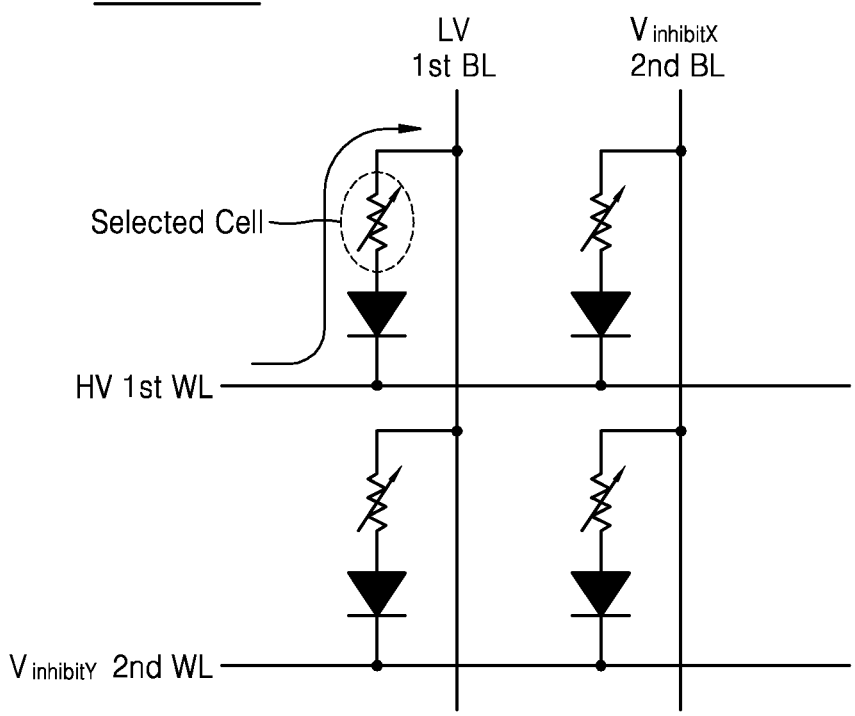

FIGS. 6A and 6B are circuit diagrams illustrating examples of a set write operation and a reset write operation.

When a memory cell disposed on a region where a first word line 1st WL and a first bit line 1st BL cross each other to perform the set write operation, a high voltage is applied to the first bit line 1st BL and a low voltage is applied to the first word line 1st WL as shown in FIG. 6A. In addition, in order to prevent the data from being written in remaining memory cells, various kinds of inhibit voltages $V_{inhibitx}$ and $V_{inhibity}$ may be provided. For example, a first inhibit voltage $V_{inhibitx}$ may be provided to the second word line 2nd WL and a second inhibit voltage $V_{inhibity}$ may be provided to the second bit line 2nd BL. Since a forward current is supplied to the selected memory cell, the set write operation in which a resistance level of the variable resistance is reduced may be performed with respect to the selected memory cell.

In addition, when the reset write operation is performed on the selected memory cell, as shown in FIG. 6B, a low voltage is applied to the first bit line 1st BL and a high voltage having relatively higher level is applied to the first word line 1st WL. In addition, in order to prevent the data from being written in remaining memory cells, various kinds of inhibit voltages $V_{inhibitx}$ may be provided. For example, a second inhibit voltage and $V_{inhibity}$ $V_{inhibity}$ may be provided to the second word line 2nd WL and a first inhibit voltage $V_{inhibitx}$ may be provided to the second bit line 2nd BL. Since a backward current is supplied to the selected memory cell, the reset write operation in which a resistance level of the variable resistance is increased may be performed with respect to the selected memory cell.

As shown in FIGS. 6A and 6B, a polarity of the voltage applied to the memory cell in the set write operation and a polarity of the voltage applied to the memory cell in the reset write operation may be different from each other. Also, biasing voltages such as the inhibit voltages $V_{inhibitx}$ and $V_{inhibity}$ may be provided to the non-selected word lines and the bit lines in order to reduce the leakage current occurring in the non-selected memory cells. Accordingly, in an array (e.g., a tile) sharing the word lines and the bit lines, the set write operation and the reset write operation may not be performed simultaneously.

FIGS. 6A and 6B show examples of a bipolar type of memory device, however, the inventive concept is not limited thereto. For example, the operation in which the set write operation is performed on some of the tiles and the reset write operation is performed on the other some of the tiles from among the tiles included in one group may be applied to a unipolar type memory device.

FIG. 7 is a block diagram of a memory device 300 in the context of a write operation according to an embodiment of the inventive concept. In FIG. 1, the write/read circuit 120 includes multiple sense amplifiers and multiple write drivers. For example, sense amplifiers and write drivers may correspond one-for-one with designated tiles. In FIG. 7, it is assumed that a sense amplifier SA and write driver WD are included in each one of a plurality of tiles.

However, in FIG. 7 only a first tile (Tile 1) and a second tile (Tile 2) among the plurality of tile in the memory cell array of the memory device 300 are shown. Tile 1 and Tile 2 are further assumed to be in the same group. The memory device 300 further includes control logic 330 for controlling write and read operations with respect to Tile 1 and Tile 2. Each of Tile 1 and Tile 2 includes memory cells of a portion of the constituent memory cell array as well as certain peripheral circuits used during the execution of write operations and read operations with respect to the memory cells. For example, Tile 1 include a first memory cell array portion, a first row switch block X_SW BLK1, a first column switch block Y_SW BLK1, and a first sense amplifier/write driver SA/WD 1. Tile 2 includes similar components.

One possible approach to the execution of a write operation by the memory device 300 shown in FIG. 7 will now be described.

The control logic 330 receives various control signals CTRL, a command CMD, and an address ADDR for performing the write operation from a memory controller (not shown), and generates various signals for controlling the write operations with respect to Tile 1 and Tile 2 in response to the received address/command/control signals. The control logic 330 may be used to control the execution of at least one simultaneous write operation with respect to Tile 1 and Tile 2 in response to the write command, whereby a set write operation and a reset write operation may be simultaneously performed.

If the set write operation is performed on Tile 1 and the reset write operation is performed on Tile 2 during a first simultaneous write operation, the control logic 330 provides Tile 1 with at least one set pulse Pulse_Wset for performing the set write operation, in addition to an address ADDR_1 for selecting memory cells of Tile 1. Additionally, the control logic 330 provides Tile 2 with at least one reset pulse Pulse_Wreset for performing the reset write operation, in addition to an address ADDR_2 for selecting memory cells of Tile 2.

Here, the write data communicated with the write command includes a first write data portion (DATA1) provided to Tile 1 via the first sense amplifier/write driver SA/WD 1, and a second write data portion (DATA2) provided to Tile 2 via the second sense amplifier/write driver SA/WD2. DATA1 may be set data written by decreasing memory cells resistance values, and DATA2 may be reset data written by increasing memory cell resistance values. According to the first simultaneous write operation, at least some of the set data and reset data may be simultaneously written to respective tiles. Following execution of the first simultaneous write operation, a verification read operation may be performed with respect to first read data (Dout1) sensed from Tile 1 and second read data (Dout2) sensed from Tile 2.

After the first simultaneous write operation, a second simultaneous write operation may be sequentially performed. During the second simultaneous write operation, a reset write operation may be performed with respect to Tile 1 and a set write operation may be performed with respect to Tile 2. Here, the control logic 330 provides Tile 1 with at least one reset pulse Pulse_Wreset, in addition to an address ADDR_3 for selecting the memory cell, in order to perform the reset write operation on memory cells of Tile 1. Also, the control logic 330 provides Tile 2 with at least one set pulse Pulse_Wset, in addition to an address ADDR_4 for selecting the memory cell, in order to perform the set write operation on memory cells of Tile 2.

Here, the write data may include a third portion of write (DATA3) provided to Tile 1 via the first sense amplifier/ write driver SA/WD1, and a fourth portion of write data (DATA4) provided to Tile 2 via the second sense amplifier/write driver SA/WD2. DATA3 may be reset data written by increasing memory cell resistance values, and DATA4 may be set data written by decreasing memory cell resistance values. Following execution of the second simultaneous write operation, a verification read operation may be performed with respect to third read data (Dout3) sensed from Tile 1 and fourth read data (Dout4) sensed from Tile 2.

Characteristics of the write operation illustrated in FIG. 7 will be described below with reference to FIGS. 8A, 8B, 8C, and 8D, where FIGS. 8A, 8B, 8C, and 8D are diagrams showing pre-read/write operations with respect to a tile and current consumption characteristics corresponding thereto.

Figure 8A:
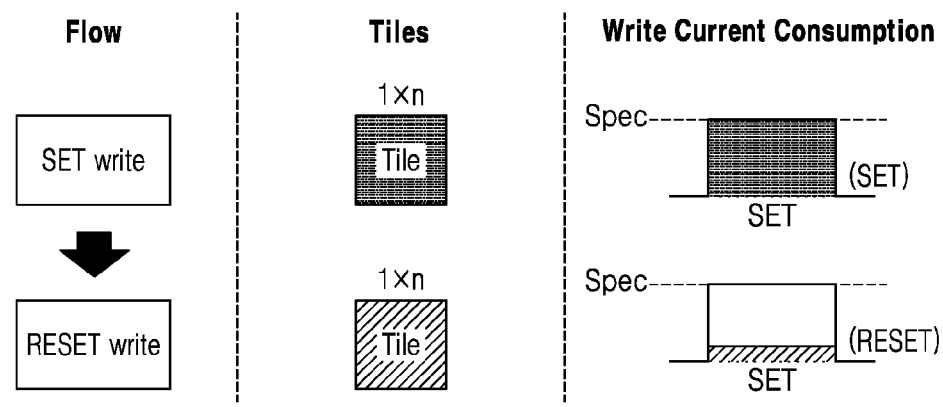
FIGS. 8A, 8B, 8C, and 8D are diagrams showing pre-read operation/write operation with respect to a tile, and power consumption characteristics thereof.

As shown in FIG. 8A, if the set write operation and the reset write operation are separately performed with respect to a certain tile, there is an allowable current value according to specification supported by the memory device. For example, in a case of the bipolar type memory device, a magnitude of the current consumed in the set write operation may be greater than that of the reset write operation. In this case, when the set write operation is performed on 'n' memory cells in one tile, electric current that is close to the allowable degree may be consumed, and the number of memory cells in which data is written during one write operation may be limited to 'n'.

After that, when 'n' memory cells are selected in the reset write operation, the reset write operation may be performed with respect to the selected memory cells. According to the write operation shown in FIG. 8A, the number of the memory cells in which the data is written in one write operation is limited to 'n', and the current that is far behind the allowable degree is only consumed in the reset write operation, and thereby degrading efficiency in using the electric current.

Figure 8B:
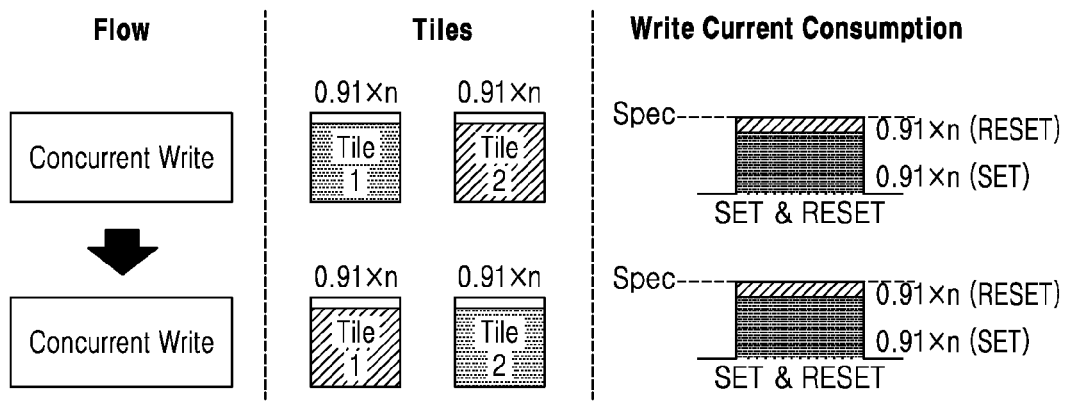

However, the simultaneous write operation according to the embodiment of the inventive concept is performed, the data may be written in at least two tiles as shown in FIG. 8B. If it is assumed that the magnitude of the current consumed to perform the set write operation is ten times greater than that of the reset write operation, the set write operation may be performed with respect to about (0.91×'n' memory cells) in Tile 1 during the first simultaneous write operation, and simultaneously, the reset write operation may be performed with respect to about (0.91×'n' memory cells) in Tile 2. In this case, the data may be written in (1.8×'n' memory cells) that are increased by about 80% greater than those of FIG. 8A, and the current may be efficiently used to be close to the allowable degree so that the data may be written in a lot of memory cells.

Also, during the second simultaneous write operation, the reset write operation may be performed with respect to about (0.91×'n' memory cells) in Tile 1, and simultaneously, the set write operation may be performed with respect to about (0.91×'n' memory cells) in Tile 2. In the second simultaneous write operation, the allowable current amount supported by the memory device may be used efficiently so that the data may be written in the memory cells, the number of which increases by about 80% when compared with FIG. 8A. That is, the electric current may be effectively used in each of the write operations, and moreover, the number of the memory cells in which the data is written simultaneously may be increased. Thus, efficiency of the write operation may be improved.

Referring to FIG. 8B, the amount of the current consumed in the first simultaneous write operation and the amount of the current consumed in the second simultaneous write operation may be substantially equal to each other, and the current amount supported by the memory device may be effectively used. Also, in each of the simultaneous write operations, the number of memory cells on which the set write operation is performed and the number of memory cells on which the reset write operation is performed may be equal to each other, and the total number of memory cells in which the data is written simultaneously may be greater than that of FIG. 8A.

Figure 8C:
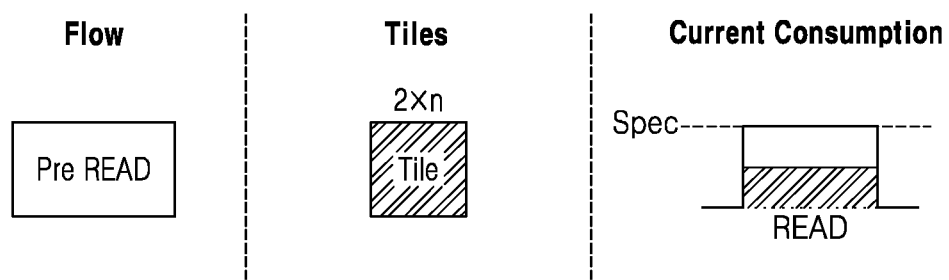

In addition, FIG. 8C shows an example in which a pre-read operation is performed in response to the write command in a case where the set write operation and the reset write operation are separately performed. As shown in FIG. 8C, since the data is written in 2×'n' memory cells in response to the write command, the data may be read from 2×'n' memory cells during the pre-read operation. The electric current consumed in the read operation may be less than that of the set write operation. In addition, even when the data is read from 2×'n' memory cells the current consumption amount may be much less than the allowable current amount.

Figure 8D:
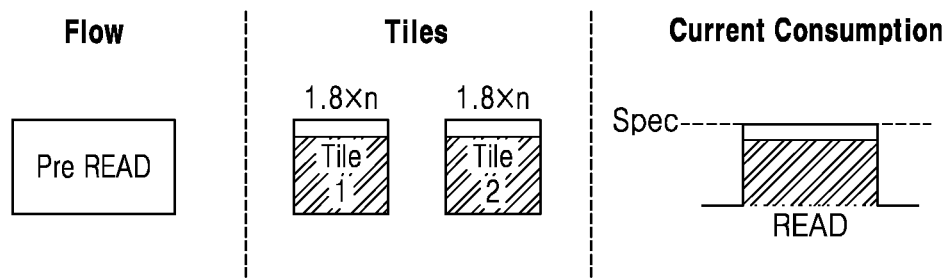

However, according to the embodiment of the inventive concept, the data may be written in about 3.6×'n' memory cells in response to the write command as shown in FIG. 8D, and the data may be read from about 3.6×'n' memory cells during the pre-read operation. Since the current consumption amount in the read operation is relatively small, even when the read operation is performed in about 3.6×'n' memory cells, the electric current may be effectively used within the allowable current consumption amount.

Numerical values of FIGS. 8B and 8D are examples, characteristics of the pre-read operation and the write operation according to the embodiments of the inventive concept may be changed variously. For example, the number of tiles in which the simultaneous write operation is performed in one group may be changed, and a ratio between the current consumption amounts in the set write operation and the reset write operation may be changed. The numerical values shown in FIGS. 8B and 8D may be adjusted according to the number of the tiles or the ratio between the current consumption amounts.

Figure 9:
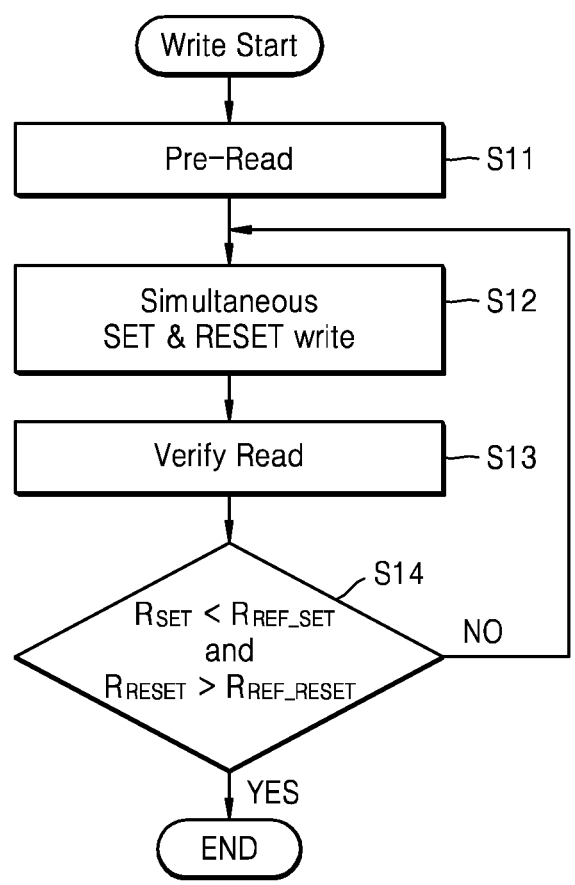
FIG. 9 is a flowchart illustrating a method of operating a memory device according to an embodiment of the inventive concept.

FIG. 9 is a flowchart illustrating a method of operating the memory device according to an embodiment of the inventive concept.

As shown in FIG. 9, when the write operation starts in response to the write command, the pre-read operation is performed with respect to at least some of the memory cells (S11). At least two tiles are included in one group, and after the pre-read operation, the simultaneous write operation including the set write operation and the reset write operation may be performed with respect to the at least two tiles (S12). The simultaneous write operation may be performed according to one of the previously described embodiments, and a verification read operation may be performed for verifying the data written in the simultaneous write operation (S13). According to the verification read operation, the verification of the read data is performed (S14), and the write operation may be terminated or the simultaneous write operation and the verification operation may be repeatedly performed according to the verification result. In FIG. 9, one simultaneous write operation is illustrated; however, the write data may be written through two or more simultaneous write operations as described in the previous embodiments.

Figures 10A, 10B:
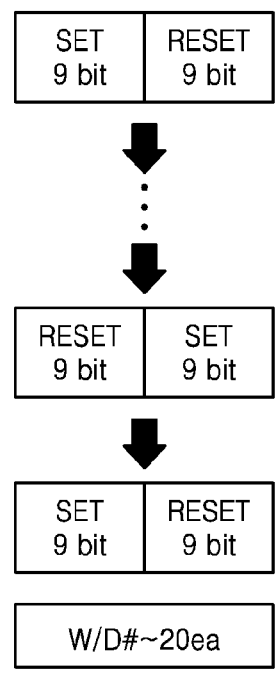
FIGS. 10A and 10B are diagrams showing the number of write drivers that are necessary when performing a write operation in the memory device according to the embodiment of the inventive concept.

FIGS. 10A and 10B are diagrams showing the number of write drivers that are necessary when performing the write operation in the memory device according to an embodiment of the inventive concept. In FIGS. 10A and 10B, the set current is about 10 µA and the reset current is about 1 µA, and data of 200 bits is written in response to one write command. Also, the allowable current consumption amount is about 100 µA.

As shown in the table of FIG. 10A, if the set write operation and the reset write operation are performed separately, ten set write operations and one reset write operation may be sequentially performed in response to one write command. In this case, the data of 10 bits may be written in each of the set write operations and the data of 100 bits may be written in one reset write operation in consideration of the allowable current consumption amount. Since the data of 100 bits has to be written simultaneously in the reset write operation, at least one hundred of write drivers are necessary for performing the data write operation.

On the other hand, the set write operation and the reset write operation are simultaneously performed according to the embodiment of the inventive concept, the data of 200 bits may be written through about eleven times of simultaneous write operations. For example, in one simultaneous write operation, data of 9 bits may be written by the set write operation, and at the same time, data of 9 bits may be written by the reset write operation (otherwise, the data of 10 bits may be written by the reset write operation). In this case, the current consumed in the simultaneous write operation may satisfy the allowable current consumption amount, that is, about 100 µA. As shown in FIG. 10B, the plurality of tiles may be included in one group, and the set write operation and the reset write operation may be alternately performed with respect to each of the tiles.

According to the embodiment of the inventive concept, data of about 20 bits or less may be written in one simultaneous write operation, and thus, twenty or less write drivers are necessary for performing the data write operation. That is, since relatively less write drivers are necessary, it is advantageous in reducing a chip size of the memory device and manufacturing costs may be reduced.

Figures 11A, 11B:
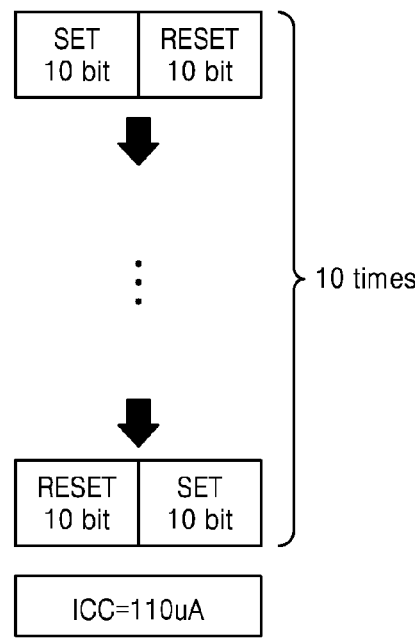
FIGS. 11A and 11B are diagram showing a value of a maximum current that is necessary when performing a write operation in the memory device according to the embodiment of the inventive concept.

FIGS. 11A and 11B are diagrams showing maximum current values that are necessary when performing a write operation in the memory device according to the embodiment of the inventive concept. In FIGS. 11A and 11B, it is assumed that the set current is about 10 µA, the reset current is about 1 µA, and data of 200 bits is written in response to one write command. However, FIGS. 11A and 11B show a case where the number of the write drivers is limited to 20.

As shown in FIG. 11A, if the set write operation and the reset write operation are performed separately, it is impossible to write the data of a large bit in the reset write operation because the number of write drivers is restricted. Accordingly, five times of set write operations and five times of reset write operations may be sequentially performed in response to one write command, and the data of 20 bits may be written in each of the write operations. In this case, in each of the set write operations, an electric current of 10 µA is necessary for writing one bit, and thus, the electric current of 200 µA has to be supported as the maximum allowable current amount in order to perform the set write operation on the data of 20 bits.

However, according to the embodiment of the inventive concept, about ten times of simultaneous write operations may be sequentially performed in response to one write command, and in each of the simultaneous write operations, the set write operation for writing the data of 10 bits and the reset write operation for writing the data of 10 bits may be performed simultaneously. As shown in FIG. 11B, one group may include a plurality of tiles, and the set write operation and the reset write operation for writing the data of 10 bits may be sequentially performed with respect to each of the plurality of tiles.

According to the embodiment of the inventive concept, data of 20 bits may be written in one simultaneous write operation, and the electric current of about 110 µA only may be supported as the maximum current amount for performing one simultaneous write operation. That is, the allowable current consumption amount may be reduced, and thus, a power device included in the memory device may be fabricated easily.

Figure 12A:
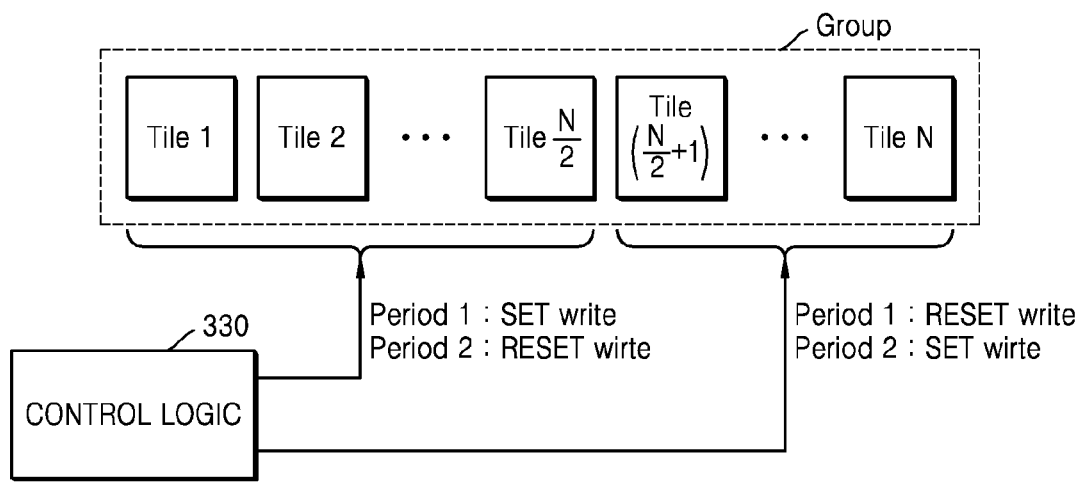
FIGS. 12A and 12B are diagrams illustrating a write operation according to another embodiment of the inventive concept.
Figure 12B:
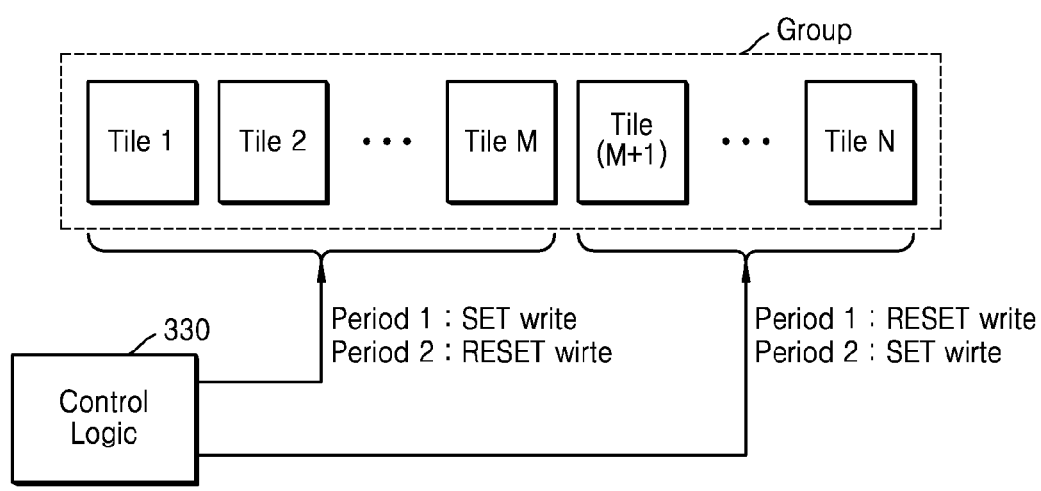

FIGS. 12A and 12B are diagrams illustrating a write operation according to another embodiment of the inventive concept. One or more simultaneous write operations may be performed in response to the write command. For example, a period in which a first simultaneous write operation is performed is defined as a first period Period1 and a period in which a second simultaneous write operation is performed is defined as a second period Period2.

As shown in FIG. 12A, the group may be defined as a unit in which the simultaneous write operation is performed, and the group may include N tiles. The control logic 330 may control the set write operation and the reset write operation performed on the N tiles. For example, the first simultaneous write operation may be performed in the first period Period1, and then, the set write operation may be performed with respect to half of the tiles included in the group (for example, first through N/2-th tiles) and the reset write operation may be simultaneously performed on remaining half of the tiles (for example, (N/2+1)st tile through N-th tile) in the first simultaneous write operation.

After that, a second simultaneous write operation may be performed in the second period Period2, and then, the reset write operation may be performed with respect to half of the tiles included in the group (for example, the first tile through N/2-th tile), and simultaneously, the set write operation may be performed with respect to remaining half of the tiles (for example, (N/2+1)st tile through the N-th tile) in the second simultaneous write operation.

Referring to FIG. 12B, the number of tiles on which the set write operation is performed and the number of tiles in which the reset write operation in one group may be different from each other. For example, the first simultaneous write operation may be performed in the first period Period1 so that the set write operation may be performed with respect to M tiles included in the group and simultaneously, the reset write operation may be performed with respect to (N-M) tiles in the first simultaneous write operation. Also, the reset write operation may be performed with respect to M tiles included in the group and simultaneously, the set write operation may be performed with respect to (N-M) tiles in the second simultaneous write operation.

Figure 13A:
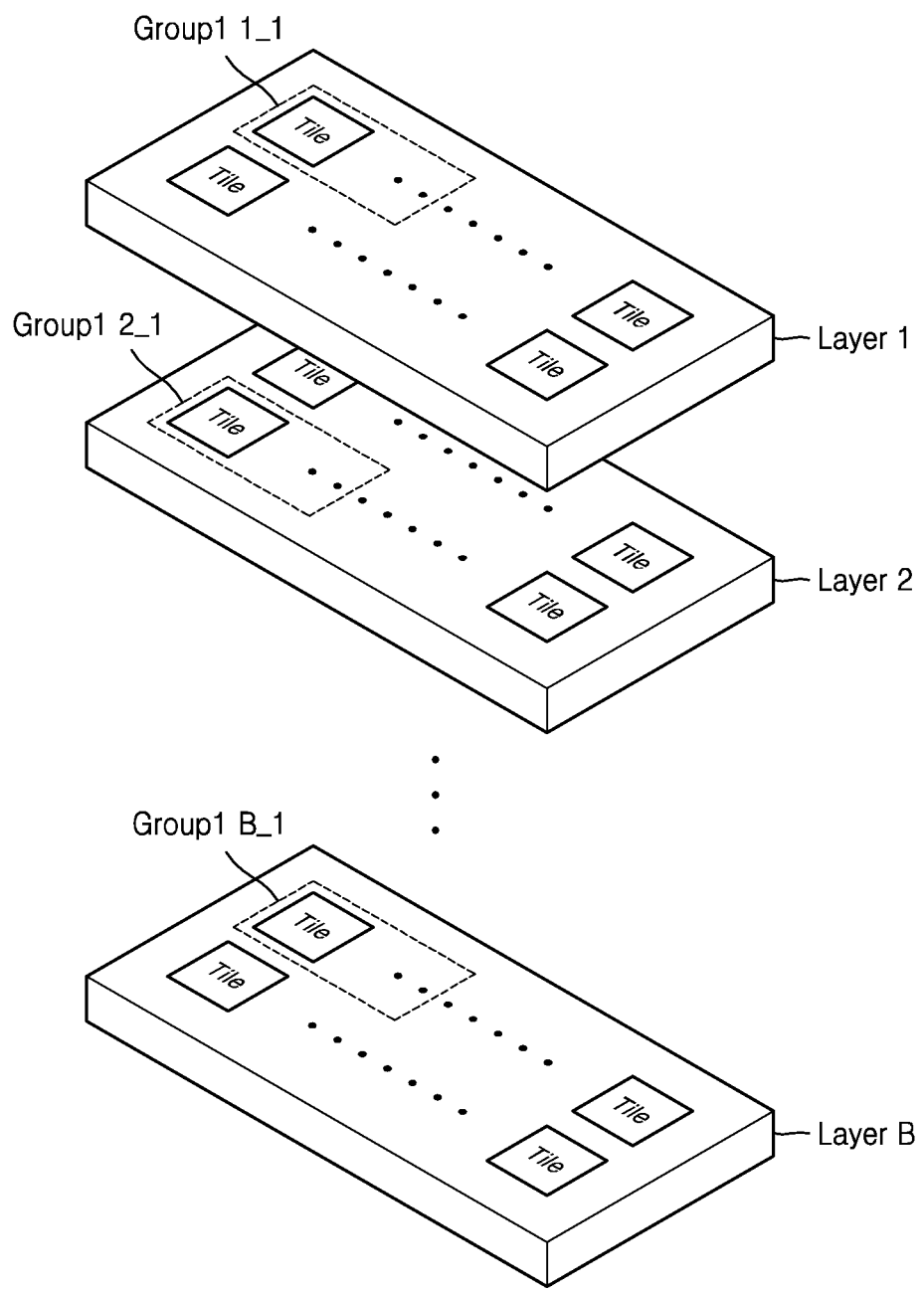
FIGS. 13A and 13B are diagrams illustrating a write operation according to another embodiment of the inventive concept.
Figure 13B:
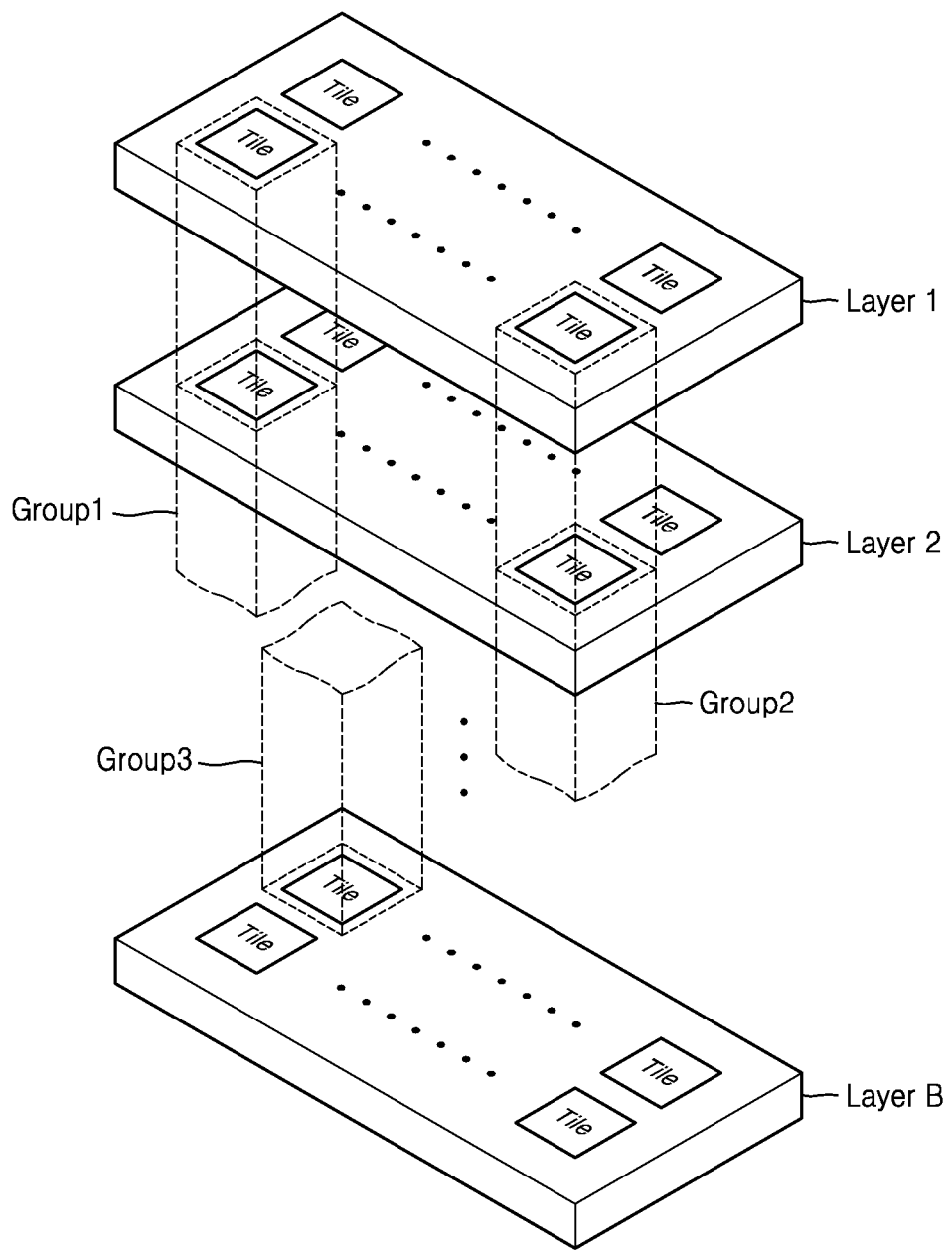

FIGS. 13A and 13B are diagrams illustrating a write operation according to another embodiment of the inventive concept. In FIGS. 13A and 13B, the illustrated memory device include a plurality of layers (Layer 1 through Layer B), wherein each of the layers includes a plurality of tiles.

Groups may be defined to include the tiles arranged in multiple layers. Referring to FIG. 13A, the groups may be defined in each of the layers, and one group may include two or more tiles arranged in the same layer. For example, two or more tiles arranged in Layer 1 may be included in one group Group1_1, and two or more tiles included in Layer 2 may be included in another group Group2_1. Similarly, two or more tiles arranged in Layer B may be included in yet another group GroupB_1.

In contrast, referring to FIG. 13B, two or more tiles included in at least two different layers may be included in one group. For example, as shown in FIG. 13B, a plurality of groups (e.g., Group 1 through Group 3) may include the tiles that are arranged in different layers. The simultaneous write operation described in the above embodiment may be performed respectively with respect to the groups shown in FIGS. 13A and 13B.

Figure 14:
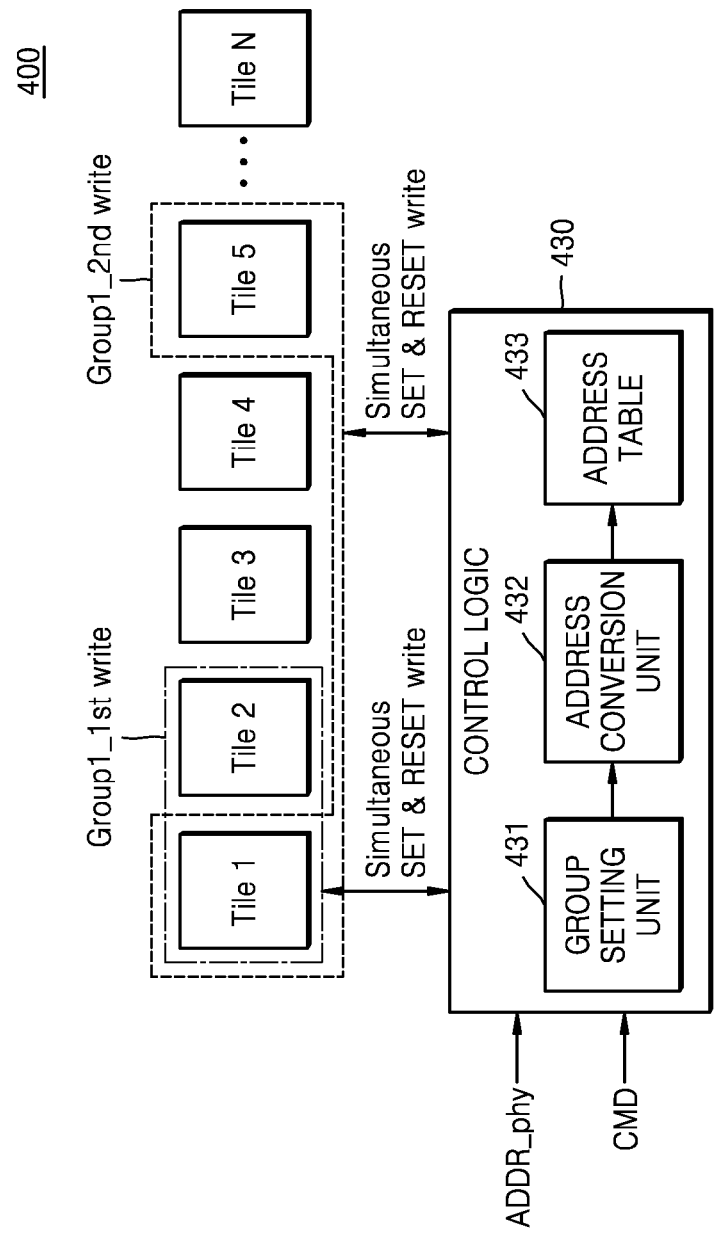
FIG. 14 is a diagram illustrating a write operation according to another embodiment of the inventive concept.

FIG. 14 is a diagram illustrating a write operation according to another embodiment of the inventive concept.

As shown in FIG. 14, a memory device 400 includes Tile 1 through Tile N, and a control logic 430. The control logic 430 may control memory operations such as writing and read operations with respect to Tile 1 through Tile N. Also, the control logic 430 may include a group setting unit 431, an address conversion unit 432, and an address table 433.

According to the embodiment of FIG. 14, tiles included in one group may not be fixed, but may vary depending on a received write command. A plurality of groups may be defined with respect to Tile 1 through Tile N, and the simultaneous write operation may be performed with respect to each of the groups. For example, the group including Tile 1 may be defined as a first group Group1.

When the write operation is performed in response to a first write command, Tile 1 and Tile 2 may be included in a first group (Group1_1st write). Accordingly, at least one simultaneous write operation may be performed with respect to Tile 1 and Tile 2, as described above, in response to a first write command. However, when the write operation is performed in response to a second write command, the tiles included in the first group (Group1_2nd write) may be changed. For example, Tile 1 and Tile 4 may be included in the first group Group1. Accordingly, the simultaneous write operation will be performed with respect to Tile 1 and Tile 4 in response to a second write command following the first write command.

The group setting unit 431 may be used to generate "tile information" regarding tiles in various groups from among the Tile 1 through Tile N when a particular write command is received, and then, provides the address conversion unit 432 with the tile information. For example, the memory device 400 may receive a physical address ADDR_phy that represents a location in which the data is to be written from a memory controller (not shown), and the address conversion unit converts the physical address ADDR_phy with reference to the information transmitted from the group setting unit 431 to generate a converted address. For example, if the physical address ADDR_phy indicates Tile 1 and Tile 2, the physical address ADDR_phy may be converted into an address indicating Tile 1 and Tile 4.

Therefore, if a write command indicates that write data should be written to memory cells of Tile 1 and Tile 2, the memory device 400 may perform the simultaneous write operation(s) by using an empty tile (e.g., Tile 4) in which the data is not yet written. Accordingly, Tile 1 and Tile 4 may be defined as one group, and the address conversion unit 432 converts the physical address ADDR_phy to a converted address designating Tile 1 and Tile 4. The address conversion information may be stored in the address table 433, and the data may be read with reference to the information stored in the address table 433 when performing the read operation. Also, if the tiles included in the group are changed in a next write operation, the information stored in the address table 433 may be updated in correspondence with the change.

Figure 15:
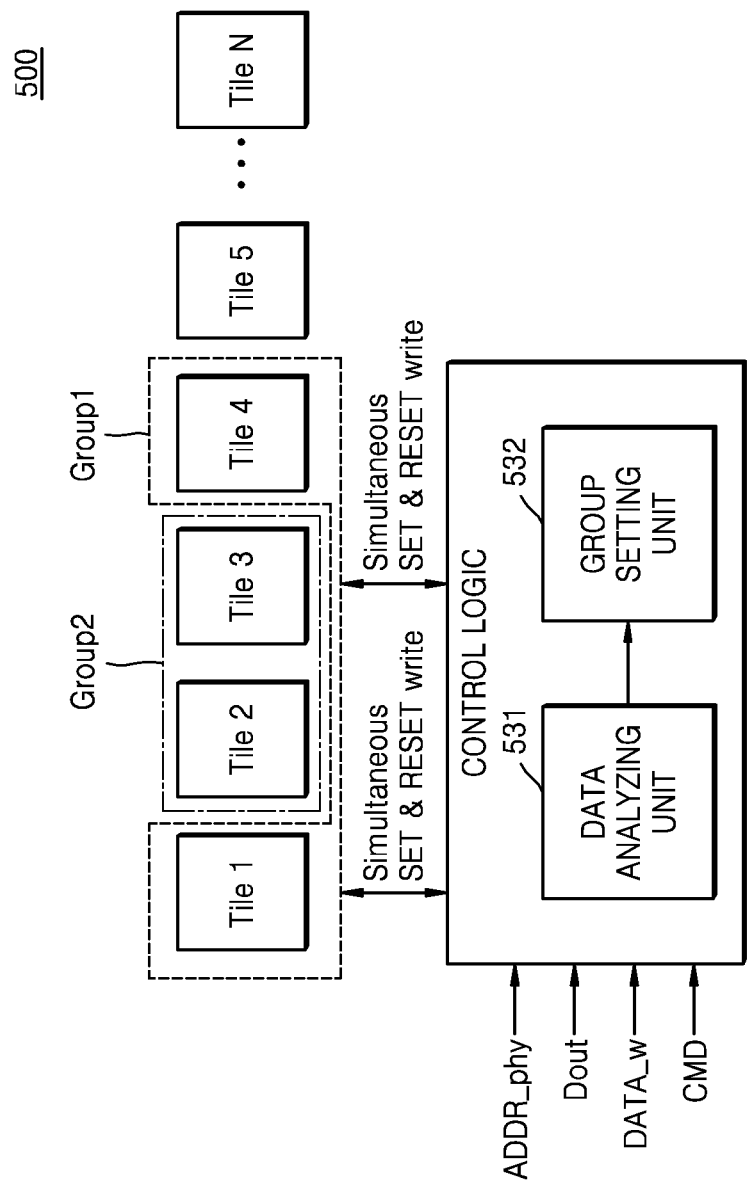
FIG. 15 is a diagram illustrating a write operation according to another embodiment of the inventive concept.

FIG. 15 is a diagram illustrating a write operation according to another embodiment of the inventive concept. According to the present embodiment, the tiles are grouped by using at least one of pre-read data Dout and write data DATA_w.

As shown in FIG. 15, a memory device 500 may include a plurality of tiles Tile 1 through Tile N, and a control logic 530. The control logic 530 may control memory operations such as a write operation and a read operation performed on the plurality of tiles Tile 1 through Tile N. Also, the control logic 530 may include a data analyzing unit 531 and a group setting unit 532. The data analyzing unit 531 and the group setting unit 532 are included in the control logic 530 in FIG. 15; however, at least one of the data analyzing unit 531 and the group setting unit 532 may be disposed at an outside of the control logic. An example of operating the memory device 500 of FIG. 15 will be described below with reference to data comparison results of FIG. 16.

Write data may be input with a write command (hereinafter, referred to as input data), for example, a request for write data of 4 bits per each tile may be input with a request for write data in four tiles. In response to the write command, a pre-read operation may be performed with respect to memory cells in which the data is to be written.

The data analyzing unit 531 may perform comparison between the input data and the pre-read data. For example, by comparing the input data in Tile 1 with the pre-read data, the number of data to be written in Tile 1 by the set write operation and the number data to be written by the reset write operation may be analyzed. If it is assumed that the write operation is skipped in the memory cell in which the input data and the pre-read data are the same as each other, the reset write operation for write data of 3 bits has to be performed with respect to Tile 1 in the example of FIG. 16, and the reset write operation for write data of 1 bit and the set write operation for write data of 1 bit have to be performed with respect to Tile 2. Also, the reset write operation for write data of 2 bits and the set write operation for write data of 1 bit have to be performed with respect to Tile 3, and the set write operation for write data of 3 bits has to be performed with respect to Tile 4.

The above analysis result may be provided to the group setting unit 532, and the group setting unit 532 may perform grouping operation based on the data analysis result. The grouping is performed in response to one write command, and the group defined through the grouping may be referred to as a temporarily logical group.

When performing the grouping, the grouping may be performed so that the number of data written through the set write operation and the number of data written through the reset write operation may be the same as or similar to each other in one group. In the example of FIG. 16, Tile 1 and Tile 4 may be set as a first group and Tile 2 and Tile 3 may be set as a second group. Since the set write operation and the reset write operation may be performed simultaneously in one group, the reset write operation performed on Tile 1 and the set write operation performed on Tile 4 may be simultaneously performed in the first group.

In addition, in the second group, the set write operation is performed on Tile 2 and the reset write operation is performed on Tile 3 during the first simultaneous write operation. Also, the reset write operation is performed on Tile 2 and the set write operation is performed on Tile 3 during the second simultaneous write operation.

Figure 17:
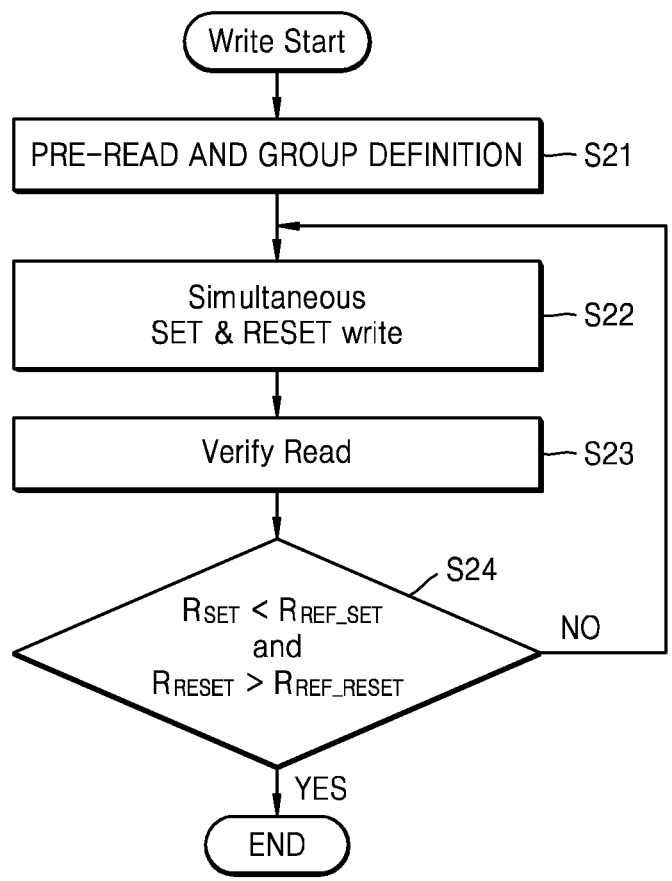
FIG. 17 is a flowchart of a method of operating a memory device according to another embodiment of the inventive concept.

FIG. 17 is a flowchart illustrating a method of operating a memory device according to another embodiment of the inventive concept.

As shown in FIG. 17, when the write operation starts in response to the write command, a pre-read operation performed on at least some of the memory cells may be performed. The groups may be defined by analyzing the data obtained through the pre-read operation and the write data accompanied with the write command (S21). The embodiment illustrated with respect to FIGS. 15 and 16 may be applied to the grouping operation.

A simultaneous write operation including a set write operation and a reset write operation may be performed with respect to at least two tiles included in one group (S22). The simultaneous write operation may be performed according to the previous embodiment, and a verification read operation may be performed in order to verify the written data after the simultaneous write operation (S23). A verification with respect to the data read according to the verification read operation is performed (S24), and according to the verification result, the write operation is finished or the simultaneous write operation and the verification operation may be repeatedly performed.

Figure 18:
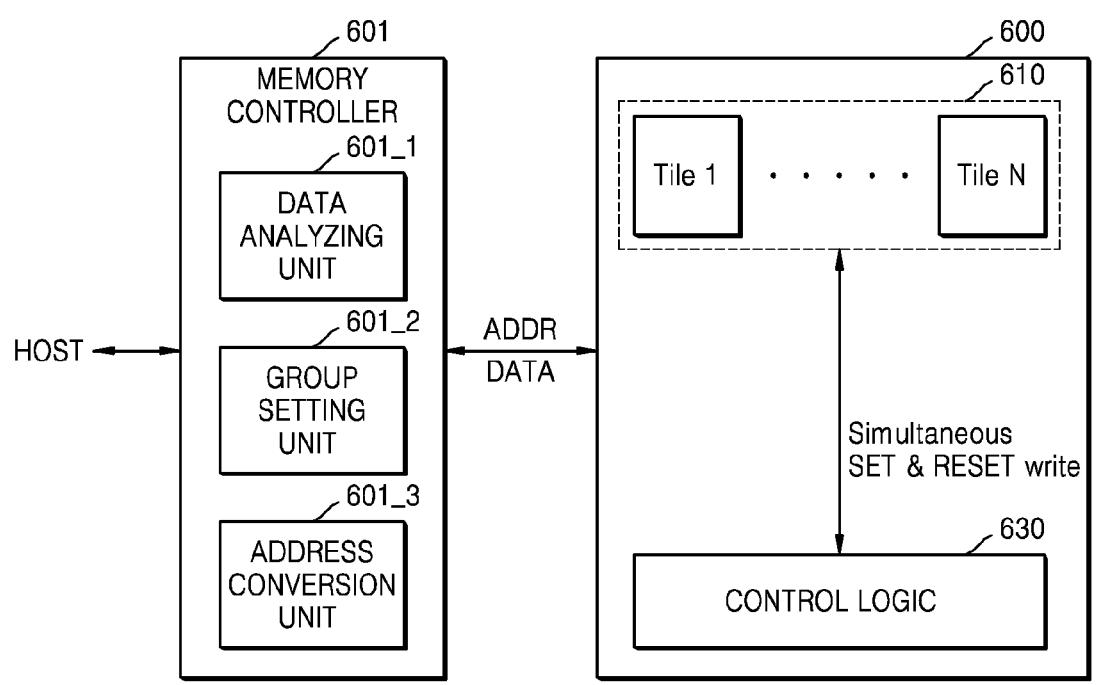
FIG. 18 is a diagram illustrating a write operation according to another embodiment of the inventive concept.

FIG. 18 is a diagram illustrating a write operation according to another embodiment of the inventive concept. FIG. 18 illustrates an example of performing the data analyzing operation and the grouping operation according to the previous embodiment by using a memory controller 601.

As shown in FIG. 18, the memory system 20 may include a memory controller 601 and a memory device 600. The memory device 600 may include a memory cell array 610 including a plurality of tiles Tile 1 through Tile N and a control logic 630. In addition, the operation of defining the group illustrated with respect to FIGS. 14 through 17 may be performed by the memory controller 601. Accordingly, the memory controller 601 may include at least one functional block selected from a data analyzing unit 601_1, a group setting unit 601_2, and an address conversion unit 601_3.

The memory controller 601 may control writing and read operations with respect to the memory device 600 according to a request from a host. According to the embodiment of the inventive concept, the memory controller 601 may perform a grouping operation on Tile 1 through Tile N included in the memory device 600. As an example, when a request for write data in tiles at certain locations is transmitted from the host, the memory controller 601 may select tiles that are appropriate for performing the simultaneous write operation and define the selected tiles as a group. In this case, the address conversion unit 601_3 may generate an address ADDR that is converted to select the tiles included in the above group and provides the memory device 600 with the converted address ADDR.

In addition, the memory controller 601 performs an analyzing operation of the write data (DATA) and the read data obtained through the pre-read operation, and may define the group based on the analyzing result. Similarly to the previous embodiment, the data analyzing unit 601_1 compares each bit values of the write data (DATA) and the read data, and may detect the number of data to be written through the set write operation and the number of data to be written through the reset write operation. The group setting unit 601_2 may define the groups based on the comparison result and the detection result.

Figure 19:
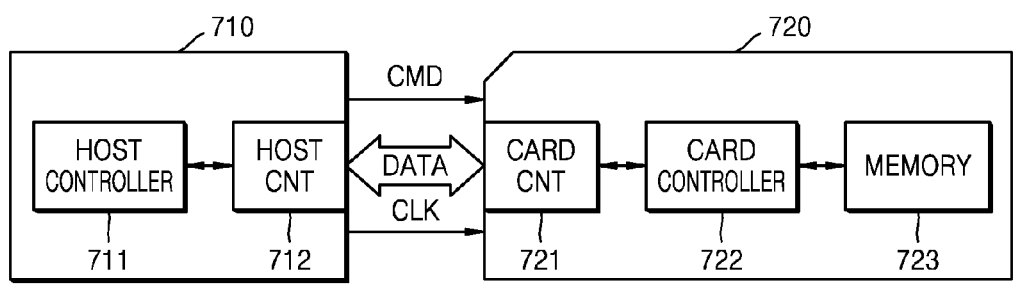
FIG. 19 is a block diagram of a memory card system to which a resistive memory system according to an embodiment of the inventive concept is applied.

FIG. 19 is a block diagram illustrating an example in which the resistive memory system according to an embodiment of the inventive concept is applied to a memory card system 700.

Referring to FIG. 19, the memory card system 700 may include a host 710 and a memory card 720. The host 710 may include a host controller 711 and a host connection unit 712. The memory card 720 may include a card connection unit 721, a card controller 722, and a memory device 723.

The memory device 723 may include a memory cell array, and the memory cell array may include a plurality of tiles. Here, the memory card 720 may be formed according to the embodiments illustrated in FIGS. 1 through 18, and accordingly, at least two tiles are defined as a group. In addition, the memory card 720 may perform the simultaneous write operation, in which the set write operation and the reset write operation are simultaneously performed on the group.

The host 710 may write data in the memory device 720 or read the data stored in the memory card 720. The host controller 711 may transmit a clock signal CLK generated in a clock generator (not shown) in the host 710 and the data DATA to the memory device 720 via the host connection unit 712.

The card controller 722, in response to the command received through the card connection unit 721, may store data in the memory device 723 in synchronization with the clock signal generated in the clock generator (not shown) in the card controller 722. The memory device 723 may store the data transmitted form the host 710.

The memory card 720 may be realized as a compact flash card (CFC), a micro drive, a smart media card (SMC), a multimedia card (MMC), a security digital card (SDC), a memory stick, and a USB flash memory driver.

Figure 20:
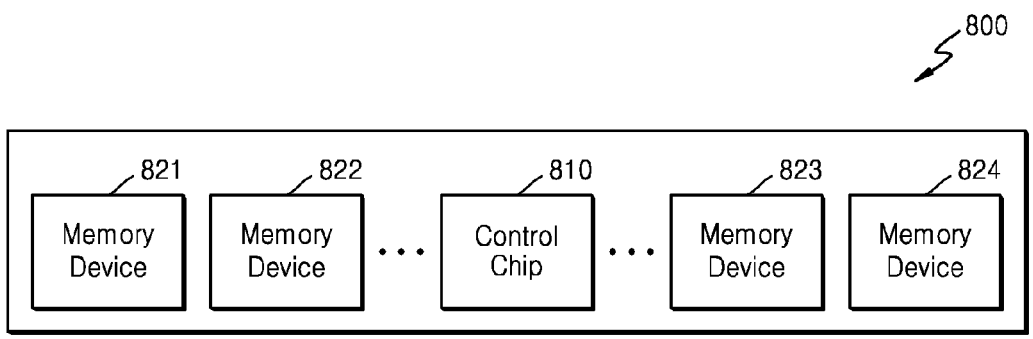
FIG. 20 is a diagram of a resistive memory module according to an embodiment of the inventive concept.

FIG. 20 is a diagram illustrating a resistive memory module 800 according to an embodiment of the inventive concept. Referring to FIG. 20, the resistive memory module 800 may include memory devices 821 through 824, and a control chip 810. Each of the memory devices 821 through 824 may be formed according to the embodiments illustrated in FIGS. 1 through 18. The control chip 810 may control the memory devices 821 through 824 in response to various signals transmitted from an external memory controller. For example, the control chip 810 activates memory devices 821 through 824 corresponding to various commands and addresses transmitted from outside in order to control writing and read operations. Also, the control chip 810 may perform post processes of the read data output from the memory devices 821 through 824, for example, error detection and correction operations of the read data.

According to the one or more embodiments of the inventive concept, each of the memory devices 821 through 824 may include a memory cell array that includes a plurality of tiles. Accordingly, at least two tiles may be defined as one group, and the simultaneous write operation, in which the set write operation and the reset write operation are simultaneously performed, is performed with respect to the group.

Figure 21:
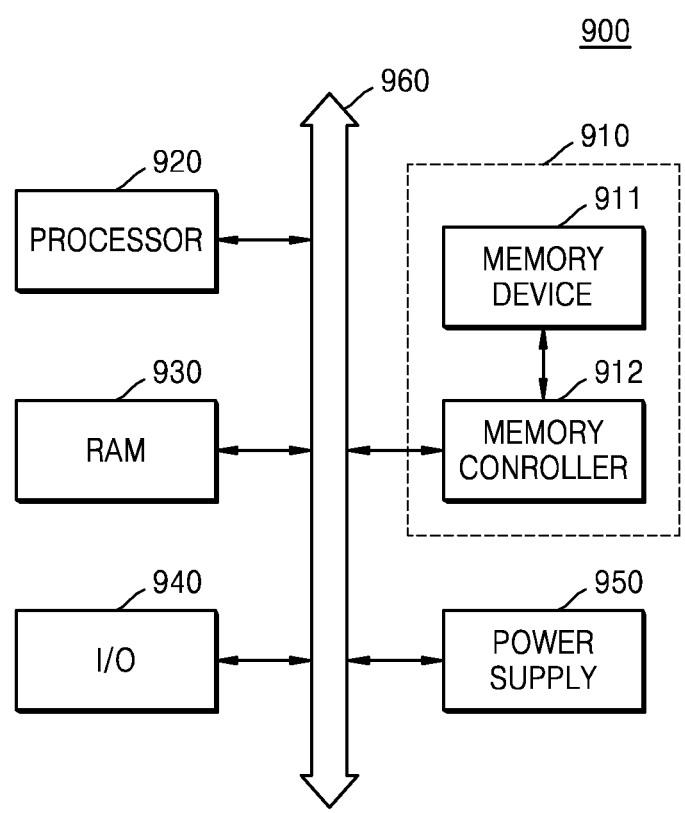
FIG. 21 is a block diagram of a computing system including a resistive memory system according to an embodiment of the inventive concept.

FIG. 21 is a block diagram illustrating a computing system 900 including a resistive memory system according to an embodiments of the inventive concept.

Referring to FIG. 21, the computing system 900 may include a memory system 910, a processor 920, a random access memory (RAM) 830, an input/output device 940, and a power device 950. In addition, the memory system 910 may include a memory device 911 and a memory controller 922. Also, although not shown in FIG. 21, the computing system 900 may further include ports through which the computing system 900 may communicate with a video card, a sound card, a memory card, and a USB device, or other electronic devices. The computing system 900 may be realized as a personal computer, or a portable electronic device such as a laptop computer a mobile phone, a personal digital assistant (PDA), or a camera.

The processor 920 may execute certain calculates or tasks. According to the present embodiment, the processor 920 may be a micro-processor or a central processing unit (CPU). The processor 920 may communicate with the RAM 930, the input/output device 840, and the memory system 910 via a bus 960 such as an address bus, a control bus, and a data bus. Here, the memory system 910 and/or the RAM 930 may be formed according to the embodiments illustrated in FIGS. 1 through 18.

According to the present embodiment, the processor 920 may be connected to an expanded bus such as a peripheral component interconnect (PCI) bus.

The RAM 930 may store data that is necessary in operations of the computing system 900. As described above, the RAM 930 may adopt the memory device according to the one or more embodiments of the inventive concept. Otherwise, a DRAM, a mobile DRAM, an SRAM, a PRAM, an FRAM, or an MRAM may be used as the RAM 930.

The input/output device 940 may include an input unit such as a keyboard, a keypad, and a mouse, and an output unit such as a printer and a display. The power device 950 may supply an operating voltage that is necessary for operating the computing system 900.

While the inventive concept has been particularly shown and described with reference to exemplary embodiments thereof, it will be understood that various changes in form and details may be made therein without departing from the scope of the following claims.

What is claimed is:

1. A method writing data in a resistive memory device having a memory cell array divided into divided into N tiles including a first tile and a second tile, wherein the N tiles are functionally arranged in M groups including a first group including the first tile and second tile, the method comprising:
   receiving a write command and corresponding write data; and
   executing a write operation defined by the write command and write data by:
      performing a first simultaneous write operation by performing a set write operation on resistive memory cells of the first tile while simultaneously performing a reset write operation on resistive memory cells of the second tile in response to the write command; and
      performing a second simultaneous write operation by performing a reset write operation on resistive memory cells of the first tile while simultaneously performing a set write operation on resistive memory cells of the second tile in response to the write command,
   wherein the N tiles of the memory cell array are provided on a plurality of layers including a first layer and a second layer vertically disposed under first layer in the resistive memory device.

2. The method of claim 1, wherein the first tile and second tile include resistive memory cells respectively connected between first lines and second lines, such that during the first simultaneous write operation, a first electric current flows from the first lines to the second lines through the resistive memory cells of the first tile on which the set write operation is performed, and a second electric current flows from the second lines to the first lines through the resistive memory cells of the second tile on which the reset write operation is performed.

3. The method of claim 1, wherein a first amount of current consumed during the first simultaneous write operation and a second amount of current consumed during the second simultaneous write operation are identical.

4. The method of claim 1, wherein during each one of the first simultaneous write operation and the second simultaneous write operation, a number of memory cells on which the set write operation is performed is the same as a number of memory cells on which the reset write operation is performed.

5. The method of claim 1, wherein the first tile and the second tile are disposed on the first layer.

6. The method of claim 1, wherein the first tile is disposed on the first layer and the second tile is disposed on the second layer.

7. The method of claim 1, further comprising:
   performing a pre-read operation on at least one of the tiles of the first group before performing either one of the first simultaneous write operation and the second simultaneous write operation in response to the write command.

8. The method of claim 1, further comprising:
   after at least one of performing the first simultaneous write operation and performing the second simultaneous write operation, performing a verification read operation on at least a portion of the write data to generate verification read data; and
   again performing at least one of the first simultaneous write operation and the second simultaneous write operation according to the verification read data.

9. A method writing data in a resistive memory device having a memory cell array divided into a plurality of tile including a first tile and a second tile, such that resistive memory cells of the first and second tiles are connected between first lines and second lines of the memory cell array, the method comprising:
   receiving a first write command;
   performing a first set write operation by applying a current in a first direction through a first set of resistive memory cells of the first tile in response to the first write command; and simultaneously,
   performing a first reset write operation by applying a current in a second direction different from the first direction through a second set of resistive memory cells of the second tile in response to the first write command, and
   performing a second reset write operation by applying the current in the second direction through a third set of resistive memory cells of the first tile in response to the first write command; and simultaneously
   performing a second set write operation by applying the current in the first direction through a fourth set of resistive memory cells of the second tile in response to the first write command.

10. The method of claim 9, wherein the current in the first direction flows from the second lines to the first lines through the resistive memory cells, and the current in the second direction flows from the first lines to the second lines through the resistive memory cells.

11. The method of claim 9, wherein the plurality of tiles includes a third tile, the method further comprising:
   receiving a second write command after receiving the first write command;
   performing a first set write operation by applying the current in the first direction through a fifth set of resistive memory cells of the first tile in response to the second write command; and simultaneously,
   performing a first reset write operation by applying the current in the second direction through a sixth set of resistive memory cells of the third tile in response to the second write command.

12. The method of claim 9, further comprising:
performing a pre-read operation with respect to at least one of the first and second tiles in response to the first write command to generate read data.

13. The method of claim 12, wherein the first and second tiles are selected from among the plurality of tiles according to a result of analyzing the read data and the write data.

14. A method writing data in a resistive memory device having a memory cell array divided into a plurality of tiles, the method comprising:
receiving a first write command, a first write address and corresponding first write data;
executing a first write operation defined by the first write command, first write address and first write data on the basis of a first tile and a second tile of a group including a plurality of tiles by:
in response to the first write command and the first write address, selecting the first tile and the second tile from among the plurality of tiles;
performing a first simultaneous write operation by performing a set write operation on resistive memory cells of the first tile while simultaneously performing a reset write operation on resistive memory cells of the second tile;
performing a second simultaneous write operation by performing a reset write operation on resistive memory cells of the first tile while simultaneously performing a set write operation on resistive memory cells of the second tile; and
performing an address conversion on the first write address during the selecting of the first tile and the second tile from among the plurality of tiles.

15. The method of claim 14, further comprising:
receiving a second write command, a second write address and corresponding second write data;
executing a second write operation defined by the second write command, second write address and second write data on the basis of a third tile and a fourth tile of the group including the plurality of tiles by:
in response to the second write command and the second write address, selecting the third tile and the fourth tile from among the plurality of tiles;
performing a first simultaneous write operation by performing a set write operation on resistive memory cells of the third tile while simultaneously performing a reset write operation on resistive memory cells of the fourth tile; and
performing a second simultaneous write operation by performing a reset write operation on resistive memory cells of the third tile while simultaneously performing a set write operation on resistive memory cells of the fourth tile,
wherein at least one of the first and second tiles is different from at least one of the third and fourth tiles.

16. The method of claim 14, wherein a first amount of current consumed during the first simultaneous write operation and a second amount of current consumed during the second simultaneous write operation are identical.

17. The method of claim 1, wherein during each one of the first simultaneous write operation and the second simultaneous write operation, a number of memory cells on which the set write operation is performed is the same as a number of memory cells on which the reset write operation is performed.

* * * * *